(12) United States Patent
Yamazaki et al.

(10) Patent No.: US 6,458,637 B1
(45) Date of Patent: Oct. 1, 2002

(54) THIN FILM SEMICONDUCTOR AND METHOD FOR MANUFACTURING THE SAME, SEMICONDUCTOR DEVICE AND METHOD FOR MANUFACTURING THE SAME

(75) Inventors: Shunpei Yamazaki, Tokyo; Akiharu Miyanaga, Kanagawa; Jun Koyama, Kanagawa; Takeshi Fukunaga, Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/916,789

(22) Filed: Jul. 27, 2001

Related U.S. Application Data

(60) Continuation of application No. 09/659,992, filed on Sep. 12, 2000, now Pat. No. 6,291,275, which is a continuation of application No. 09/065,654, filed on Apr. 23, 1998, now Pat. No. 6,133,073, which is a division of application No. 08/802,675, filed on Feb. 19, 1997, now Pat. No. 5,893,730.

(30) Foreign Application Priority Data

Feb. 23, 1996 (JP) ................................................ 8-61893
Feb. 23, 1996 (JP) ................................................ 8-61894

(51) Int. Cl.⁷ .......................... H01L 21/00; H01L 21/48
(52) U.S. Cl. .................... 438/151; 438/152; 438/166; 438/168
(58) Field of Search ............................... 438/30, 29, 27, 438/688, 672, 151, 152, 166, 168; 257/66, 57, 59, 349, 408

(56) References Cited

U.S. PATENT DOCUMENTS

| | | | | |
|---|---|---|---|---|
| 4,712,874 A | * | 12/1987 | Sekimura et al. | 350/339 |
| 5,275,851 A | * | 1/1994 | Fonash et al. | 438/166 |
| 5,312,771 A | * | 5/1994 | Yonehara | 438/151 |
| 5,382,537 A | * | 1/1995 | Noguchi | 438/166 |
| 5,426,064 A | * | 6/1995 | Zhang et al. | 438/166 |
| 5,501,989 A | * | 3/1996 | Takayama et al. | 438/166 |
| 5,523,240 A | * | 6/1996 | Zhang et al. | 438/151 |
| 5,529,937 A | * | 6/1996 | Zhang et al. | 148/DIG. 16 |
| 5,545,571 A | * | 8/1996 | Yamazaki et al. | 438/151 |
| 5,576,870 A | * | 11/1996 | Ohmae | 359/95 |
| 5,624,851 A | * | 4/1997 | Takayama et al. | 438/166 |
| 5,643,826 A | * | 7/1997 | Ohtani et al. | 148/DIG. 16 |
| 5,663,077 A | * | 9/1997 | Adachi et al. | 438/151 |
| 5,693,541 A | * | 12/1997 | Yamazaki et al. | 148/DIG. 16 |
| 5,821,563 A | * | 10/1998 | Yamazaki et al. | 257/344 |
| 5,858,823 A | | 1/1999 | Yamazaki et al. | |
| 5,886,366 A | | 3/1999 | Yamazaki et al. | |
| 5,893,730 A | * | 4/1999 | Yamazaki et al. | 438/166 |
| 5,949,706 A | * | 9/1999 | Chang et al. | 257/369 |
| 6,133,073 A | * | 10/2000 | Yamazaki et al. | 438/151 |
| 6,171,961 B1 | * | 1/2001 | Yamazaki et al. | 438/660 |
| 6,288,412 B1 | * | 9/2001 | Hamada et al. | 257/347 |
| 6,291,275 B1 | * | 9/2001 | Yamazaki et al. | 438/151 |
| 6,323,072 B1 | * | 11/2001 | Yamazaki et al. | 148/DIG. 1 |
| 2001/0022581 A1 | * | 9/2001 | Koyama et al. | 345/204 |
| 2001/0038555 A1 | * | 11/2001 | Kato | 365/185.17 |
| 2001/0053559 A1 | * | 12/2001 | Nagao et al. | 438/30 |

\* cited by examiner

*Primary Examiner*—Michael S. Lebentritt
(74) *Attorney, Agent, or Firm*—Fish & Richardson P.C.

(57) ABSTRACT

The present invention is related to a thin film semiconductor which can be regarded as substantially a single crystal and a semiconductor device comprising an active layer formed by the thin film semiconductor. At least a concave or convex pattern is formed intentionally on a insulating film provided in contact with the lower surface of an amorphous silicon film, whereby at least a site is formed in which a metal element for accelerating crystallization can be segregated. Therefore, a crystal nuclei is selectively formed in a portion where the concave or convex pattern is located, which carries out controlling a crystal diameter. Thus, a crystalline silicon film is obtained. A crystallinity of the crystalline silicon film is improved by the irradiation of a laser light or an intense light having an energy equivalent to that of the laser light, whereby a monodomain region in which no grain boundary substantially exit is formed.

10 Claims, 16 Drawing Sheets

*IRRADIATION OF LASER LIGHT OR INTENSE LIGHT*

| ELEMENT | CONCENTRATION (ppm) | ELEMENT | CONCENTRATION (ppm) |
|---|---|---|---|
| Fe | 0.045 | Ca | 0.16 |
| Ni | 0.016 | Mn | <0.001 |
| Na | >0.005 | Al | 0.004 |
| K | >0.004 | U *2 | <0.000031 |
| Ti *1 | <0.05 | Th *2 | <0.00016 |
| Mg | >0.005 | F *3 | 310 |
| Cu | 0.009 | Cl *2 | <0.73 |
| Cr | 0.003 | OH *4 | ND |

METHOD: POLARIZED 8EEMAN FLAME-LESS ATOMIC ABSORPTION SPECTROSCOPY

*1 ICP EMISSION SPECTROSCOPY
*2 RADIATION ANALYSIS
*3 EPMA
*4 INFRARED ABSORPTION SPECTROSCOPY

FIG. 14

THIN FILM SEMICONDUCTOR AND METHOD FOR MANUFACTURING THE SAME, SEMICONDUCTOR DEVICE AND METHOD FOR MANUFACTURING THE SAME

This application is a continuation of U.S. application Ser. No. 09/659,992, filed Sep. 12, 2000, now U.S. Pat. No. 6,291,275 which is a continuation of U.S. application Ser. No. 09/065,654, filed Apr. 23, 1998, now U.S. Pat. No. 6,133,073 which is a divisional of U.S. application Ser. No. 08/802,675, filed Feb. 19, 1997 (now U.S. Pat. No. 5,893,730).

BACKGROUND OF THE INVENTION

1. Field of the Invention

The present invention relates to a thin film semiconductor having a region which can be regarded as substantially a single crystal (hereinafter referred to as "a monodomain region"), and is formed on a substrate having an insulating surface, and to a semiconductor device using the thin film semiconductor as an active layer. More particularly, the present invention relates to a thin film transistor having an active layer constituted by a crystalline silicon film.

2. Description of the Related Art

In recent years, a technique for constituting a thin film transistor (TFT) by using a thin film silicon film (having a thickness of from several hundred to several thousand of angstroms (Å)) formed on a substrate having an insulating surface has drawn a considerable attention. A thin film transistor is widely applied to electronic devices such as ICs and liquid crystal display devices.

The most important portion of a thin film transistor is, so to speak the heart of thin film transistor, a channel forming region and a junction portion to join the channel forming region with the source/drain region. That is, the active layer has the greatest influence on the performance of a thin film transistor.

As a thin film semiconductor constituting the active layer of the thin film transistor, generally employed is an amorphous silicon film formed by plasma CVD or low pressure thermal CVD.

A thin film transistor using an amorphous silicon film is practically available at present, however, in case higher speed operation is required, a thin film transistor based on thin film silicon having good crystallinity (hereinafter referred to as "crystalline silicon film") must be employed.

For instance, in an active matrix type liquid crystal display device or in a passive type liquid crystal display device, a drive circuit for driving pixel TFFs provided to the pixel region, a circuit for handling image signals, and a memory circuit for recording various types of information, are necessary for the peripheral circuits.

Moreover, in the circuits above, the circuit for processing and controlling the image signals and the memory circuits for recording various types of information are required to have a well performance comparable to that of a known integrated circuit using a single crystal wafer. Accordingly, in case that the above-mentioned circuits are to be integrated by using a thin film semiconductor formed on the substrate, a crystalline silicon film having high crystallinity comparable to that of a single crystal must be formed on the substrate.

As methods for forming a crystalline silicon film on a substrate, known are the techniques disclosed in Japanese Laid-Open Applications 6-232059 and 6-244103 filed by the present inventors. The technique disclosed in the references above comprises forming a crystalline silicon film having excellent crystallinity by utilizing a metallic element capable of accelerating the crystallization of silicon in case of applying heat treatment at 550° C. for about 4 hours.

However, even if the technique mentioned above is employed in the active layer of a thin film transistor, the resulting thin film transistor is still unsatisfactory when used as a transistor constituting various types of arithmetic circuit, memory circuit, or the like, because the crystallinity thereof as an active layer is yet insufficient to suffice the required characteristics.

In particular, it is required that the crystalline silicon film having a crystallinity comparable to that of a single crystal is substantially free of crystal grain boundaries. This is because the grain boundaries function as an energy barrier which obstructs the path of electrons which pass to and fro between the crystals.

The present inventors have classified the crystal growth process into four steps. i.e., from a first to fourth step described below when the above technique is employed. The explanation is given with reference to FIGS. 3(A) to 3(F).

Referring to FIG. 3(A), a silicon oxide film 301 is formed as a buffer layer on the surface of a substrate. An amorphous silicon film 303 is formed thereon. The concave or convex portion 302 (only the convex portion is shown in the figure) is formed by the surface roughness or a dust that was present on the surface of the silicon oxide film.

A solution containing a metallic element that accelerates the crystallization is provided dropwise to the surface of the amorphous film 303, and is applied by spin coating. Thus is obtained a state as is shown in FIG. 3(A), in which a nickel layer 304 is retained on the surface of the amorphous silicon film 303.

The amorphous silicon film 303 is crystallized thereafter by applying heat treatment in the temperature range of from 500 to 700° C. However, in case a glass substrate is used, the heat treatment is preferably effected at a temperature of 650° C. or lower by taking the heat resistance of the glass substrate into consideration.

Then, as is indicated by an arrow in FIG. 3(B), the metallic element undergoes an isotropic internal diffusion inside the amorphous silicon film 303 as to reach the interface with the silicon oxide film 301. This is a first step.

The metallic element then segregates in the concave or convex portion 302 after migration inside the interface between the silicon oxide film 301 and the amorphous silicon film 303. This is a second step. This occurs because the metallic element seeks for an energetically stable site, and hence, in this case, the concave or convex portion 302 provides the segregation site (FIG. 3(C)).

Thus, crystal nuclei generates in the concave or convex portion 302 which functions as the segregation site, because the metallic element is present at a high concentration. In case that the metallic element is nickel, according to the study of the present inventors, crystal nuclei generates when the concentration of nickel is $1\times10^{20}$ atoms/cm$^3$ or higher.

Crystal growth initiates from the crystal nuclei. At first, crystallization proceeds in the direction approximately vertical to the surface of the silicon film. This is a third step (FIG. 3(D)).

In the region 305 where crystallization proceeded in a direction approximately vertical to the surface of the silicon film (hereinafter referred to as "the vertical growth region"), the crystallization proceeds in such a manner that the metallic element concentrated at a high concentration is pushed up with respect to the surface of the silicon film. Accordingly, metallic elements are also condensed on the surface of the amorphous silicon film 303 located at the upper side of the concave or convex portion 302. As a result, the vertical growth region 305 is obtained as a region containing the metallic element at a high concentration as compared with the other regions.

Then, crystal growth occurs from the interface 306 of the amorphous silicon film 303 that is in contact with the vertical growth region 305 in a direction approximately in parallel with the substrate (the direction shown with an arrow in FIG. 3(E)). This is a fourth step. The crystals 307 are columnar or needle-like crystals approximately equivalent to the film thickness of the amorphous silicon film 303 (FIG. 3(E)).

Because the crystals 307 grow in a direction approximately in parallel with the substrate, the growth stop by colliding with other crystals faced opposed thereto. Thus, the boundary where collision occurs as is shown in FIG. 3(F) becomes the crystal grain boundary 308. The crystal region 309 thus formed becomes a region (hereinafter referred to as "a lateral growth region") having a relatively uniform crystallinity.

Thus, in the conventional crystallization morphology, since numerous segregation sites were formed irregularly in this manner, the crystal nuclei has a high density and each crystal grain obstructs the growth each other. As a result, diameter of the crystal grains becomes small.

That is, in case of forming the active layer of a thin film transistor using a crystalline silicon film formed by the technique described above, for instance, crystal grain boundary is inevitably incorporated inside the silicon film. Accordingly, it is practically impossible to realize a crystallinity equivalent to that of a single crystal.

The diameter of crystal grain can be increased by decreasing the generation density of the crystal nuclei, however, the location of crystal nuclei depends on the segregation site of the metallic element. According to the conventional technique, the sites (for instance, the concave or convex portion 302 shown in FIG. 3(A)) which become the segregation sites are formed irregularly, and it is impossible to control the position thereof.

SUMMARY OF THE INVENTION

An object of the present invention is to form, on a substrate having an insulating film on the surface thereof, a monodomain region having a crystallinity well equivalent to that of a single crystal. Another object of the present invention is to obtain a semiconductor device having an active layer constructed by using the monodomain region.

Thus, according to one aspect of the present invention, there is provided a thin film semiconductor formed on a substrate having an insulating film formed on the surface thereof, characterized in that:

said thin film semiconductor comprises a monodomain region which can be regarded as substantially a single crystal whose crystallinity is improved by the irradiation of a laser light or an intense light having an energy equivalent to that of the laser light, wherein:

said monodomain region is formed by a plurality of columnar or needle-like crystals being aggregated approximately in parallel with the substrate: and concave or convex pattern is formed intentionally on said insulating film provided in contact with the lower surface of the thin film semiconductor.

According to another aspect of the present invention, there is provided a semiconductor device utilizing the above-mentioned monodomain region alone as an active layer. There is a feature that substantially no crystal grain boundaries exist inside the monodomain region.

According to still another aspect of the present invention, there is provided a method for manufacturing a thin film semiconductor, comprising the steps of:

forming a silicon oxide film by means of sputtering on the surface of a substrate having an insulating surface;

intentionally providing concave or convex pattern by patterning said silicon oxide film into a desired shape;

forming an amorphous silicon film by means of low pressure thermal CVD on said silicon oxide film;

forming a metallic element which accelerates the crystallization to said amorphous silicon film;

crystallizing said amorphous silicon film into a crystalline silicon film by means of heat treatment; and irradiating a laser light or an intense light having an energy equivalent to that of said laser light to said crystalline silicon film, wherein: said crystalline silicon film is formed into a monodomain region, by irradiating a laser light or an intense light having an energy equivalent to that of said laser light. Also, it is featured that an active layer is constituted by the monodomain region formed through the above steps.

The present inventors define the region obtained by the present invention as a region which can be regarded as substantially a single crystal, that is, a monodomain region. Thus, the monodomain region is defined as a region substantially free of crystal grain boundaries, and in which hardly no crystal defects attributed to transition and stacking faults is present.

The term "substantially free of crystal grain boundaries" signifies that the region is electrically inert even if a grain boundary should be present. Such electrically inert crystal grain boundaries include {111} twin grain boundary, {111} stacking fault, {221} twin grain boundary, {221} Twist twin grain boundary, etc. (see R. Simokawa and Y. Hayashi; Jpn. J. Appl. Phys. 27 (1987) pp. 751 to 758).

The present inventors assume with high possibility that the grain boundaries included in the monodomain region are electrically inert grain boundaries. That is, the apparent grain boundaries are believed to be inert regions which electrically do not hinder the movement of carriers.

Accordingly, the present inventors studied a means for increasing the crystal grain diameter to reduce the grain boundaries. As a result, they found, for the first time, a means for controlling crystal nuclei.

The means comprises, firstly, providing an extremely smooth surface state to the insulating film that is in contact with the lower surface of the amorphous silicon film. Accordingly, a silicon oxide film formed by means of sputtering using an artificial quartz target is provided as a buffer layer under the amorphous silicon film (for reference, the composition of the artificial quartz target is given in FIG. 14). The silicon oxide film thus formed is highly dense and smooth, and contains very few concave or convex portions which became segregation sites in conventional techniques.

Then, the silicon oxide film thus obtained is patterned to intentionally provide concave or convex patterns. That is, by intentionally forming segregation sites for the metallic elements which accelerate the crystallization, the locations of generating crystal nuclei can be controlled.

That is, the present means has a great advantage of making it possible to design crystals of desired size at a desired position in the stage of designing the device. This is extremely advantageous from the industrial point of view.

The present invention is also characterized in that a low pressure thermal CVD is used for forming the amorphous silicon film. The amorphous silicon film formed by means of low pressure thermal CVD contains less hydrogen and is denser as compared with an amorphous silicon film formed by plasma CVD. Hence, the amorphous silicon film obtained in the present invention is characterized in that it contains less spontaneously formed nuclei.

Nuclei that are formed spontaneously and in large number highly obstructs the control of crystal nuclei. Accordingly, it is very convenient if the number of spontaneously formed nuclei is small.

Next, means for converting large size crystals thus obtained into single crystals (more accurately, means for forming monodomain regions) was studied. As a result, it was found that monodomain regions are available by irradiating a laser light or an intense light having an energy equivalent to that of a laser light to the thus obtained crystals.

BRIEF DESCRIPTION OF THE DRAWINGS

FIG. 14 is a table showing the composition of an artificial quartz target;

DETAILED DESCRIPTION OF THE PREFERRED EMBODIMENT

The constitution of the present invention is described in further detail with reference to the embodiments below. It should be understood, however, that the present invention is not to be construed as being limited thereto.

Embodiment 1

The present embodiment describes the formation process of a monodomain region, which is the most important concept of the present invention. FIGS. 1(A) to 1(F) show the cross sectional view of the silicon film formed on a substrate having an insulating surface.

Figure 1A:
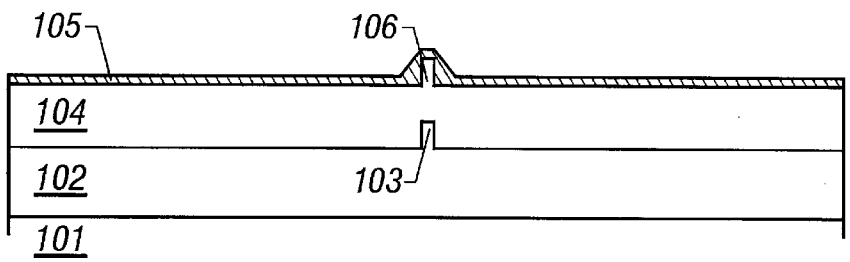
FIGS. 1(A) to 1(F) are cross sectional views showing the formation steps of a thin film semiconductor having a monodomain region.

Referring to FIG. 1(A), a silicon oxide film 102 is formed on a glass substrate 101 by sputtering. A quartz substrate or a silicon substrate can be used instead of the glass substrate. An artificial quartz target is used for the sputtering.

The silicon oxide film 102 formed by using artificial quartz target has an extremely flat and smooth surface. More specifically, for example, the height of the surface roughness is within 30 Å, and the width thereof is 100 Å or more. Even if AFM (Atomic Force Microscopy) should be used, it is difficult to recognize as irregularities.

After forming the silicon oxide film 102, patterning is effected to intentionally form a concave or convex pattern 103. In the present embodiment, reference is made specifically to fine island-like square patterns that are formed as such to intentionally obtain convex portions. However, a similar effect can be obtained by forming the patterns as such to obtain concave portions. The concave or convex pattern 103 is provided at a height corresponding to about half the film thickness of the amorphous silicon film that is formed hereinafter.

After performing patterning into a desired shape, an amorphous silicon film 104 is formed at a thickness of from 100 to 750 Å (preferably from 150 to 450 Å) by means of plasma CVD, sputtering, or low pressure thermal CVD. In case low pressure thermal CVD is employed, gaseous disilane ($Si_2H_6$) or trisilane ($Si_3H_8$) is used as the film deposition gas.

By controlling the film thickness of the amorphous silicon film 104 in the range above, not only the step of converting it into a single crystal by the irradiation of a laser light is performed effectively, but also a semiconductor device having a low OFF current can be manufactured by employing the thus obtained crystalline silicon film for the active layer of the semiconductor device.

An amorphous silicon film formed by low pressure thermal CVD generates the spontaneously formed nuclei at a low ratio in the later step of crystallization. The ratio of the spontaneously formed crystal nuclei is the ratio of generating nuclei without being influenced by the metallic element such as nickel, which accelerates the crystallization of the amorphous silicon film.

The above effects are favorable from the viewpoint of obtaining crystals having large diameter in the later step of crystallization, because the ratio of causing mutual interference (colliding each other to hinder the crystal growth) among the crystals can be reduced.

In case of forming an amorphous silicon film 104, care must be taken to the surface cleanness of the silicon oxide film 102 provided as a buffer layer. As was described hereinbefore with reference to a conventional technique, contaminations provide segregation sites for the metallic element which accelerates the crystallization as to cause nucleation.

After the amorphous silicon film 104 is formed, an UV light is irradiated in an oxygen atmosphere to form a very thin oxide film (not shown in the figure) on the surface of the amorphous silicon film 104. The oxide film is provided in order to improve the wettability of the amorphous silicon film to the solution that is applied in the later step of solution coating to introduce the metallic element.

Then, an aqueous film not shown in the figure is formed by dropping, on the surface of the amorphous silicon film 104, a solution containing the metallic element for accelerating the crystallization at a predetermined concentration. The metallic element is one or a plurality of elements selected from the group consisting of Fe, Co, Ni, Ru, Rh, Pd, Os, Ir, Pt, Cu, and Au, but according to the present inventors' study, Ni (nickel) was found to be most effective.

Considering the residual impurities in the later heating step, preferred is to employ a nickel nitrate solution. Although, a nickel acetate solution is also usable, a nickel acetate solution contains carbon, and therefore there is a fear that carbon may remain as a residue inside the film in the later heating step.

Referring to FIG. 1(A), spin coating is performed using a spinner to obtain a state in which a nickel layer 105 is retained on the amorphous silicon film 104 with an oxide film (not shown in the figure) being interposed therebetween.

In this instant, a concave or convex portion 106 is formed in the amorphous silicon film 104 provided on the upper side of the concave or convex pattern 103, in correspondence with the shape of the concave or convex pattern 103. Thus, because of surface tension, the periphery of the concave or convex portion 106 tends to provide a region in which nickel is locally condensed. Thus, in the later step of crystallization, it also functions effectively to facilitate a fourth step of crystallization (i.e., the crystallization in the direction approximately in parallel with the substrate).

In the present embodiment, the solution coating step was performed on the amorphous silicon film 104. However, the same effect can be obtained by applying it on the buffer layer, i.e., the silicon oxide film 102. before forming the amorphous silicon film. Furthermore, the solution can be applied to both surfaces of the silicon oxide film 102 and the amorphous silicon film 104.

After achieving the state illustrated in FIG. 1(A), hydrogen is removed by heating the structure at 450° C. for a duration of about 1 hour under an inert gas atmosphere. Then, the amorphous silicon film 104 is crystallized by applying heat treatment in a temperature range of from 500 to 700° C., representatively in a range of from 550 to 600° C., for 4 to 8 hours. In case of forming the film on a glass substrate, however, the heat treatment is preferably performed at a temperature not higher than 650° C. by taking the heat resistance of the glass into consideration. The crystallization proceeds in a manner described below.

Figure 1B:
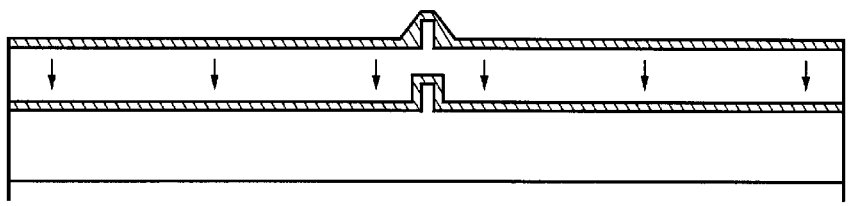
Figure 1C:
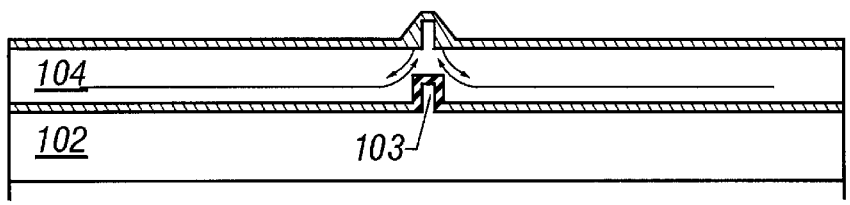
Figure 1D:
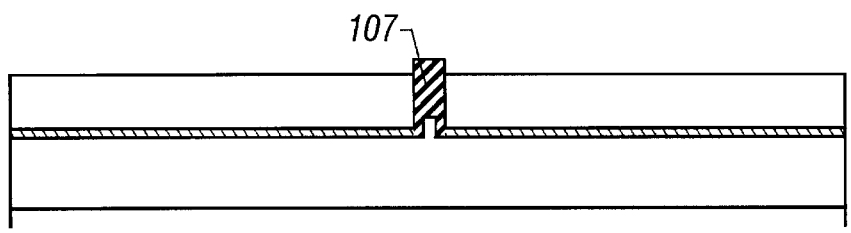
Figure 1E:
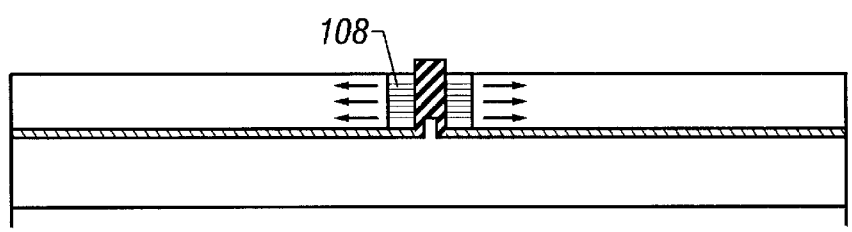

In a first step, nickel is activated by heating and diffuses isotopically inside the amorphous silicon film 104 as is indicated by the arrows (FIG. 1(B)).

Next, in a second step, nickel migrates at the interface between the silicon oxide film 102 and the amorphous silicon film 104 as to segregate in the concave or convex pattern 103. That is, the concave or convex pattern 103 functions as an intentionally formed segregation site (FIG. 1(C)).

Then, as the nickel concentration in the segregation site, i.e., the concave or convex pattern 103, becomes as high as about $1 \times 10^{20}$ atoms/cm$^3$ or even higher, nucleation occurs as to proceed crystallization in a direction approximately vertical to the silicon film surface. The vertical growth region 107 that is formed in a third step is a region containing nickel at a high concentration (FIG. 1(D)).

As the fourth step, crystal growth initiates from the vertical growth region 107 above and proceeds in a direction approximately in parallel with the silicon film surface. The lateral growth region 108 thus formed consists of a plurality of columnar or needle-like crystals being aggregated and relatively oriented in one direction, hence. from the viewpoint of crystallinity, this region is superior to the vertical growth region 107.

Because the segregation site is formed intentionally under control, the crystal diameter can be enlarged without being influenced by other crystal grains. That is, by properly designing the position of forming the segregation sites, crystals of desired size can be obtained at desired positions.

However, because the limit of crystal grain diameter depends on-the temperature and the period of time of the heat treatment, the size can be properly determined in relation with the production cost and the like. Furthermore, it should be taken into consideration that the crystal growth proceeds in the later step of converting the crystal into a single crystal.

Figure 1F:
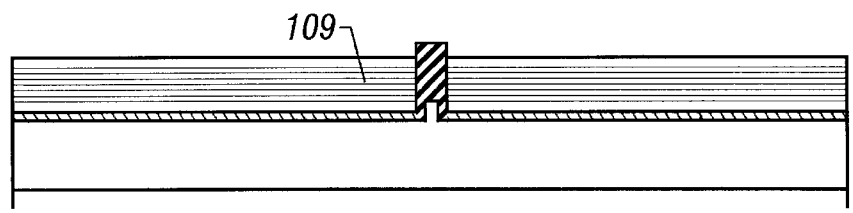

Thus is obtained a crystalline silicon film 109 as is shown in FIG. 1(F). What should be noted here is that the present invention is fundamentally different from a known technique of graphoepitaxy.

Graphoepitaxy is a technique which provides a uniform orientation to the crystalline silicon film by rendering regular shape to the surface of the undercoat film, thereby utilizing the nature of the amorphous silicon film that crystallization occurs from the most stable surface.

The present invention is characterized in that the surface morphology of the base film is varied to change the surface energy, and thereby providing region in which the metallic element for accelerating the crystallization is easily segregated. Accordingly, the present invention differs from the technique of graphoepitaxy in which the surface morphology is changed for the formation of crystal nuclei.

Figure 2A:
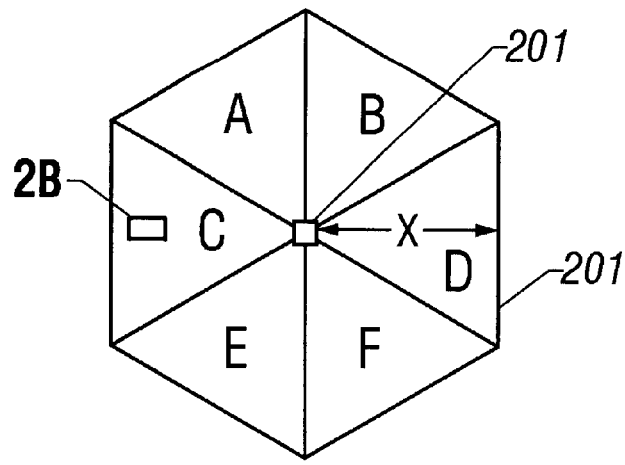
FIGS. 2(A) to 2(C) show the constitution of monodomain region.

FIG. 2(A) shows the planar view of the crystalline silicon film 109 viewed from the upper side. Referring to FIG. 2(A), a vertical growth region 201 (corresponding to the region 107 in FIG. 1(D)) formed in the third step exhibits square fine island-like pattern in the present embodiment. A lateral growth region 202 (corresponding to the region 109 in FIG. 1(F)) formed in the fourth step grows from a nuclei provided as the vertical growth region 201 at the center. Because the vertical growth region 201 in the present embodiment can be regarded as points, the lateral growth region 202 is obtained in an approximately hexagonal shape.

The reason why the lateral growth region exhibits a hexagonal shape can be explained as follows. Considering the crystal morphology of a silicon film, it is known that, in general, a nucleus surrounded by (111) surfaces grow into a crystal grain with a hexagonal shape.

In the present embodiment, nickel is used as the metal element for accelerating the crystallization. The present inventors have shown that nickel silicide is formed on the front edge portions and on the side surface portions of the columnar or needle-like crystals during the crystallization.

It is also known that (111) surface is the stable surface of nickel silicide. By taking this fact into consideration, it can be understood that the vertical growth region 301, which is the crystal nucleus, is surrounded dominantly by the (111) surface, i.e., the stable surface of the nickel silicide.

Thus, it can be readily understood that the lateral growth region 202 grown from a point, i.e., the vertical growth region 201, is shaped into an approximately hexagonal morphology by the crystal growth in a fourth step.

The lateral growth region 202 formed in the manner described above can be divided into six portions A to F as shown in FIG. 2(A). In this instance, the six portions A to F are apparently individual crystal grains. This is because defects such as slips are formed in the region at which the portions A to F collide with each other, and crystal grain boundary is thereby formed.

Figure 2B:
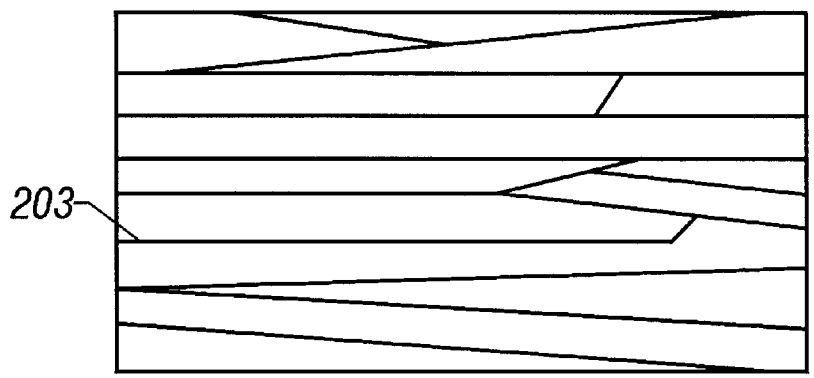

FIG. 2(B) shows a simplified view of an enlarged single portion taken from the regions A to F. Referring to FIG. 2(B), the regions A to F are each formed by an aggregation of a plurality of columnar or needle-like crystals. Hence, macroscopically, the regions each appear as single crystal grains because the crystals are densely aggregated.

The columnar or needle-like crystals are each monodomains substantially free of internal grain boundary.

Furthermore, because each of the crystals grow by eliminating the impurity elements such as nickel from the inside, metal suicides are formed on the surface of the crystals. Thus, as is shown in FIG. 2(B), a metal element, i.e., nickel, is segregated in the grain boundary 203.

Hence, the state illustrated in FIG. 2(B) shows that a plurality of monodomains are gathered to provide a region with a relatively improved crystallinity, but that the regions A to F do not form a single monodomain region.

To implement the present invention, an additional step for improving the crystallinity of the lateral growth region 202 is necessary. In the present invention, this step is specially denoted as a "step for single crystal formation".

The step for single crystal formation according to the present invention specifically comprises irradiating a laser light or an intense light having an energy equivalent thereto to the thus obtained crystalline silicon film.

Preferably, an excimer laser emitting a laser light in the ultraviolet region is used for the above purpose. More specifically, usable are KrF excimer laser (248 nm in wavelength), XeCl excimer laser (308 nm in wavelength), etc. Otherwise, an intense light using an ultraviolet ray lamp may be used to obtain the same effect.

When the crystalline silicon film is irradiated with the laser light, the irradiated surface is locally heated to a high temperature to instantaneously acquire a molten state. As is shown in FIG. 2(B), however, in practice, metal suicide that is segregated in the grain boundary portion 203 of the columnar or needle-like crystals preferentially undergo melting, and the columnar or needle-like crystals do not easily undergo melting.

Figure 2C:
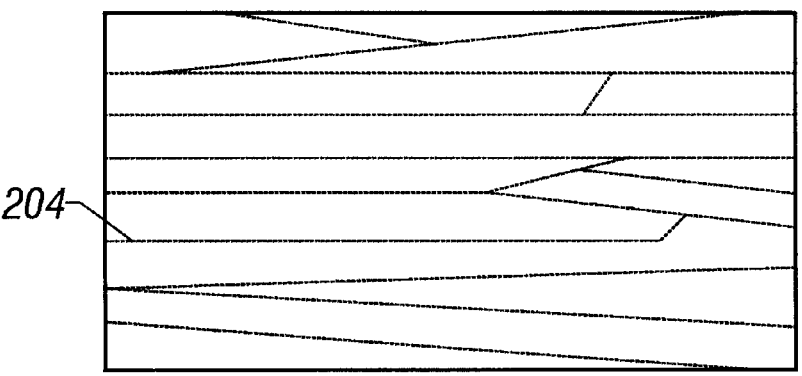
Figure 3A:
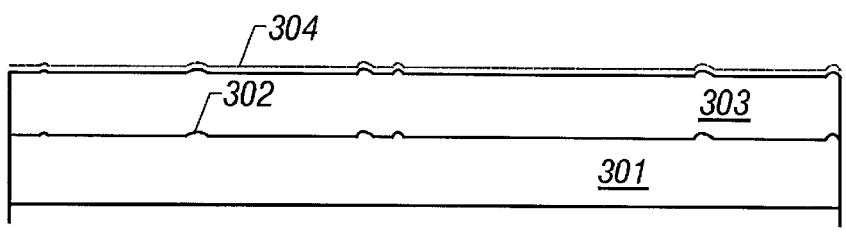
FIGS. 3(A) to 3(F) are cross sectional views showing the formation steps of a thin film semiconductor having a monodomain region.
Figure 3B:
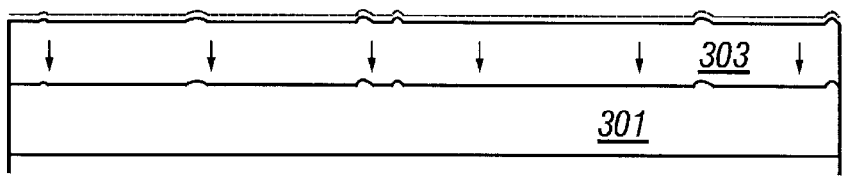
Figure 3C:
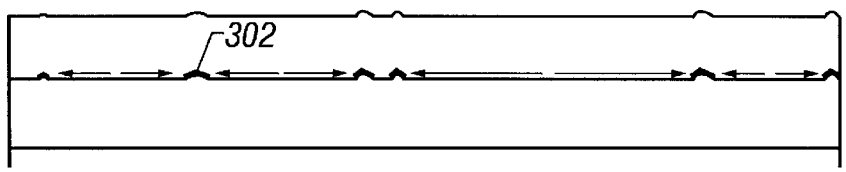
Figure 3D:
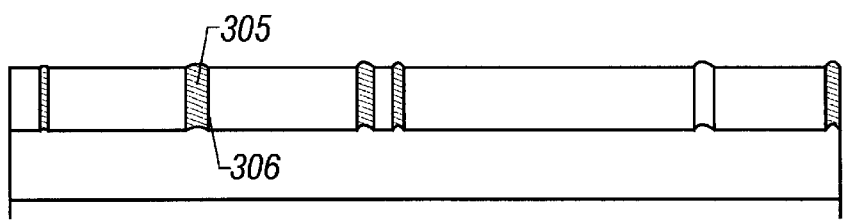
Figure 3E:
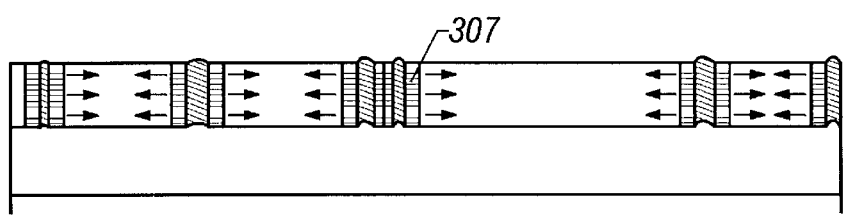
Figure 3F:
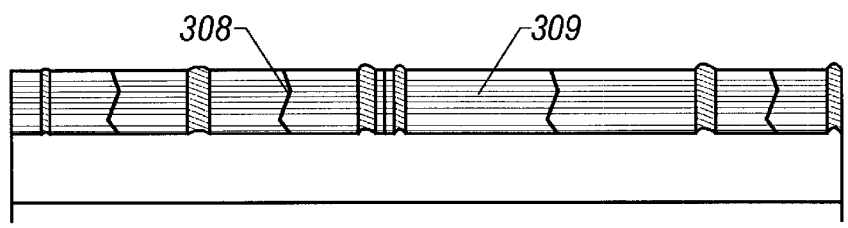

That is, in case a laser light is irradiated to a lateral growth region comprising the constitution shown in FIG. 2(B), the grain boundary 203 preferentially, but temporarily, undergo melting, and then recrystallizes. Referring to FIG. 2(C), the joint interface that is formed by the temporal dissociation and recombination of the grain boundary 203 in FIG. 2(B) is shown by broken lines 204.

In that instance, the silicon lattice in the vicinity of the grain boundary 203 rearranges as to underdo recombination in such a manner that silicon atoms are well matched. Thus, a plurality of columnar or needle-like crystals that were aggregated inside the individual regions of A to F as shown in FIG. 2(B) comprise substantially no grain boundaries as shown in FIG. 2(C).

Moreover, because the crystal defects such as dislocations and stacking faults that were present inside the needle-like or columnar crystals mostly diminish, the crystallinity of the portions which were initially the columnar or needle-like crystals also becomes considerably improved.

In this instance, the volume of each of the regions A to F expands due to the rearrangement of the silicon lattice. As a result, the silicon film is observed to undergo elevation at the grain boundaries (i.e., the outer peripheral portions of the monodomain regions) shown in FIG. 2(A), at which the regions A to F collide with each other. The elevation of the silicon film is characteristic to the case when laser irradiation treatment is performed.

In case the elevation of silicon film occurs at the grain boundaries, it is phenomenologically known that high intracrystalline crystallinity is achieved, but the reason for this is not yet well established.

Furthermore, in case an amorphous silicon film 500 Å in thickness is used, for instance, SEM observation revealed that the elevation of silicon film is known to be about 500 Å.

The crystalline silicon film thus formed through the aforementioned process steps yields a monodomain region with a highly improved crystallinity equivalent to that of a single crystal.

Another constitution of the present invention comprises forming an active layer of a semiconductor device represented by a thin film transistor, utilizing the aforementioned monodomain region alone.

Figure 7:
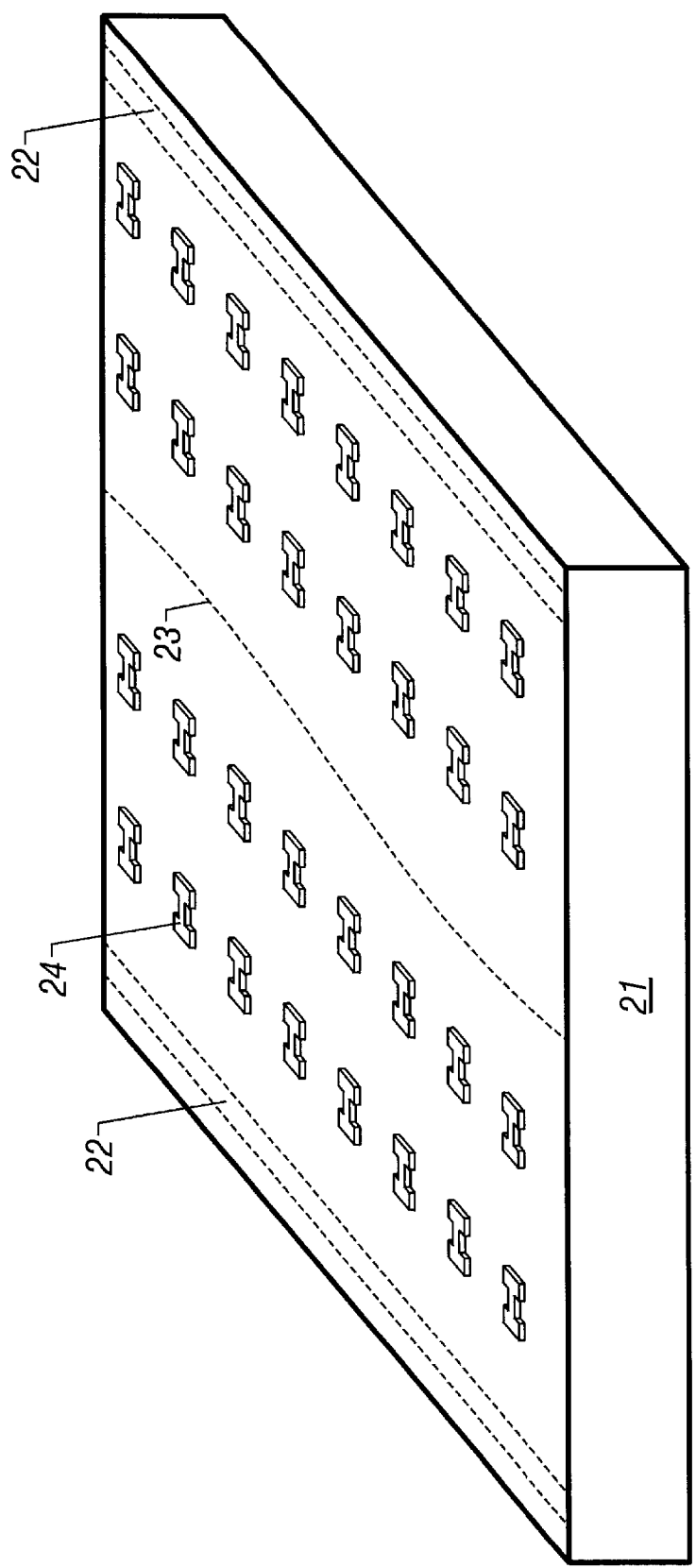
FIG. 7 shows the active layer formed on a monodomain region.

In manufacturing an active-matrix type liquid crystal display device, FIG. 7 shows an active layer 24 provided in a matrix-like arrangement on a substrate 21 having an insulating surface.

Referring to FIG. 7, the portion in which a vertical growth region was present is shown by broken lines 22. The portion 23 in which grain boundary was formed by the collision of lateral growth regions is shown by dotted lines, because it cannot be observed after the active layer 24 is formed.

As is shown in FIG. 7, the active layer 24 of the thin film transistor is formed in a matrix-like pattern in such a manner that the vertical growth region and the grain boundary may not be included in the active layer.

FIG. 7 shows a local view, but the same holds true to the entire active layer that is formed on the substrate 21. That is, the active layers for the several millions of thin transistors are formed by utilizing only the monodomain region free of grain boundaries.

Embodiment 2

The present embodiment refers to a constitution similar to that described in Embodiment 1, except that the irradiation of a laser light is replaced by the same of an intense light having an energy equivalent to that of the laser light. RTA (rapid thermal annealing) is known as a technique for implementing the constitution of the present embodiment.

RTA is a method which comprises irradiating an intense light such as an infrared light or an ultraviolet light to the object by using a lamp, etc. The method is characterized in that the treatment can be completed in a short period of time of about several to several tens of seconds, and it can be conducted at a high heating and cooling rates. Thus, the thin film on the outermost surface alone can be heated. More specifically, for instance. only the thin film formed on the surface of a glass substrate can be annealed at an extremely high temperature of about 1,000° C.

In this method, the throughput also can be considerably increased in the production process, because the period of time of treatment is short. Accordingly, this method is a very effective means from the viewpoint of increasing productivity.

Embodiment 3

The present embodiment refers to a constitution in which an active layer of a thin film transistor is constructed by using a monodomain region obtained in the process steps described in Embodiment 1. Although a top gate type constitution is described in the present embodiment, it is also possible to apply the constitution to a bottom gate type.

Figure 4A:
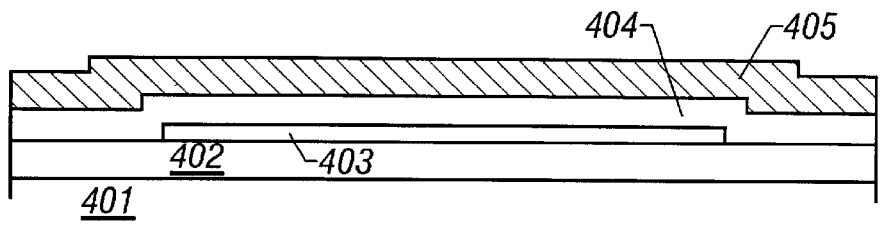
FIGS. 4(A) to 4(E) show the manufacturing process of a semiconductor device.

Referring to FIG. 4(A), a thin film semiconductor comprising a monodomain region is formed in accordance with the process steps described in Embodiment 1, and is patterned to form an active layer 403 consisting of monodomain region alone. Similarly, as is described in Embodiment 1, reference numeral 401 is a glass substrate and reference numeral 402 is a silicon oxide film.

Then, a 1,500 Å thick silicon oxide film 404 which functions as a gate insulating film is formed by plasma CVD. A silicon oxynitride film or a silicon nitride film may be used in the place of the silicon oxide film.

A 5,000-Å-thick aluminum film 405 is formed by sputtering thereafter to provide a gate electrode. Scandium is added at a concentration of 0.2% by weight into the aluminum film 405. Other metals such as tantalum or molybdenum can be used in place of aluminum. Thus is obtained a state as is shown in FIG. 4(A).

After forming the aluminum film 405, an extremely thin anodic oxide film (not shown in the figure) is formed. The anodic oxide film is formed by using an ethylene glycol solution containing 3% of tartaric acid neutralized by ammonia water as the electrolytic solution. Thus, anodic oxidation is performed in the electrolytic solution using the aluminum film 405 as the anode and platinum as a cathode.

The anodic oxide film that is formed in this step is dense, and it functions to tightly bring the resist mask. which is formed later, into contact with the aluminum film. In the present embodiment. the anodic oxide film not shown in the figure is formed at a thickness of about 100 Å. The film thickness can be controlled by the applied voltage.

The aluminum film 405 is patterned thereafter to form an island-like aluminum film pattern 406 which provides the base of the gate electrode 409. The resist mask (not shown in the figure) used in this step is left over as it is (FIG. 4(B)).

Figure 4B:
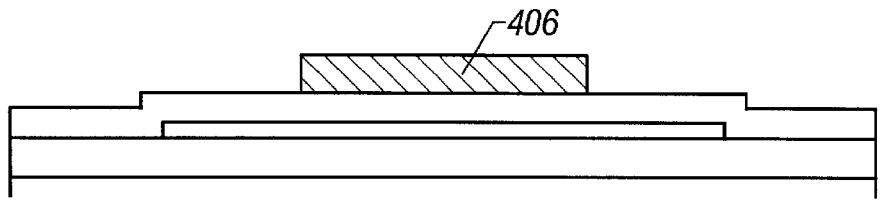

Once the state shown in FIG. 4(B) is attained, anodic oxidation is performed again by utilizing the aluminum film pattern 406 as the anode. An aqueous 3% oxalic acid solution is used as the electrolytic solution in this case. In this step of anodic oxidation, oxidation proceeds only on the side surface of the aluminum film pattern 406 because the resist mask not shown in the figure is still present. Thus, an anodic oxide film 407 is formed as is shown in FIG. 4(C).

The anodic oxide film 407 thus obtained in the present step is porous, and it may be grown to a thickness of several micrometers.

In the present embodiment, however, the porous anodic film 407 is formed at a thickness of 7,000 Å by controlling the period of time of anodic oxidation.

Figure 4C:
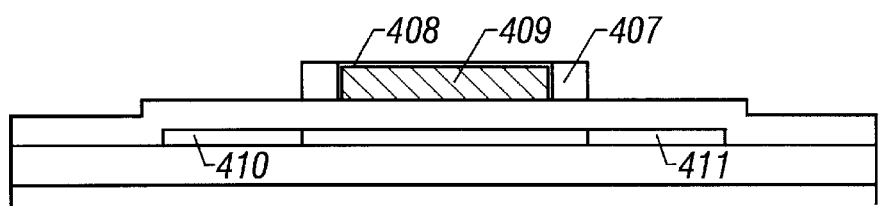

After the formation of the porous anodic oxide film 407 as is shown in FIG. 4(C), the resist mask not shown in the figure is removed. Then, another dense anodic oxide film 408 is formed by performing the anodic oxidation again under the same conditions as those employed in the previous step of forming a dense anodic oxide film. However, the anodic oxide film 408 is formed at a thickness of 800 Å.

In this step, the anodic oxide film 408 is formed as is shown in FIG. 4(C) because the electrolytic solution penetrates into the porous anodic oxide film 407.

If the anodic oxide film 408 is formed thickly at a thickness of 1,500 Å or more, an offset gate region can be formed in the later step of implanting impurity ions The dense anodic oxide film 408 functions in such a manner to prevent hillocks from generating in the later steps on the surface of the gate electrode 409.

Subsequent to the formation of the dense anodic oxide film 408, impurity ions are implanted to form source/drain regions. In the present stage, P ions are implanted to form an N-channel type thin film transistor.

Thus are obtained a source region 410 and a drain region 411 into which impurity is added at a high concentration (FIG. 4(C)).

After selectively removing the porous anodic oxide film 407 by using a mixed acid of acetic acid, phosphoric acid, and nitric acid, P ions are implanted again, but at a dose lower than that used previously for the formation of source/drain regions 410 and 411.

In this manner, low impurity density regions 412 and 413 containing impurities at a density lower than that of the source region 410 and the drain region 411 can be formed. The region 414 is formed in a self-aligning manner as a channel forming region (FIG. 4(D)).

Subsequent to the step of implanting impurity ions, a laser light, an infrared light, or an ultraviolet light is irradiated to anneal the region into which ions are implanted.

Thus are formed the source region 410, the low density impurity region 412, the channel forming region 414, the low density impurity region 413, and the drain region 411. The low density impurity region 413 is the commonly known LDD (lightly doped drain) region.

It is effective to then perform plasma hydrogenation treatment at a temperature in a range of from 300 to 350° C. for a period of time of from 0.5 to 1 hour. By conducting this treatment step, hydrogen can be added into the active layer 403 at a concentration of 5% by atomic ($1\times10^{21}$ atoms,/cm$^3$) or lower, ie. from $1\times10^{15}$ to $1\times10^{21}$ atoms/cm$^3$.

Because hydrogen thus added into the active layer 403 is active, it can be removed by neutralizing a dangling bond of silicon or the interface density level of the active layer/gate insulating film.

Figure 4D:
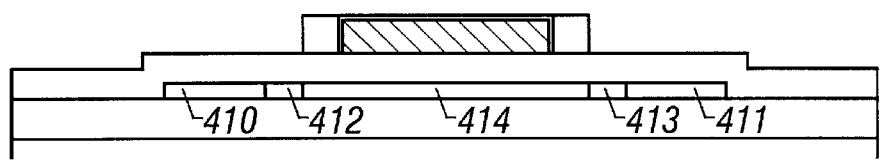

After thus obtaining the state as is shown in FIG. 4(D). an interlayer insulating film 415 is formed. The interlayer insulating film 415 is constructed by using a silicon oxide film, or a silicon nitride film, a silicon oxynitride film, a resin film, or a layered film thereof. It is preferred to use a silicon nitride film because it prevents the previously added hydrogen from being re-discharged to the outside of the device.

Then, after forming contact holes, a source electrode 416 and a drain electrode 417 are formed. In case a pixel TFT is formed in an active matrix type liquid crystal display, no take out electrode from the gate electrode 409 is necessary, but in case of a circuit TFT for use in the peripheral drive circuit, the take out electrode from the gate electrode 409 must be formed at the same time.

Figure 4E:
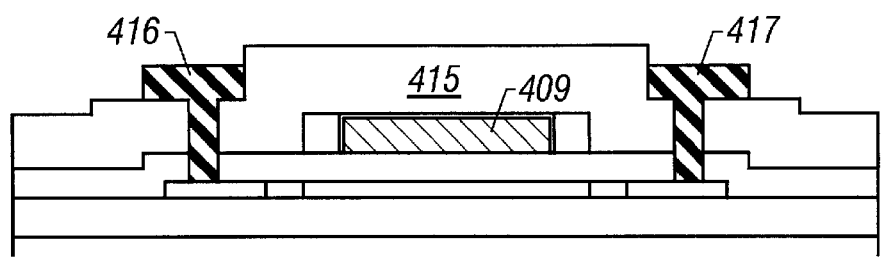

By performing heat treatment under a hydrogen atmosphere at 350° C., the entire device is hydrogenated to obtain a finished thin film transistor as is shown in FIG. 4(E).

The thin film transistor thus obtained comprises an active layer consisting of a monodomain region. Hence, a favorable field effect mobility capable of high speed operation can be obtained. Furthermore, because no grain boundaries or segregation of nickel compounds and the like occur in the channel region and the drain junction portions, a highly reliable thin film transistor can be manufactured.

Embodiment 4

Recently, a structure comprising a single crystal formed on a silicon substrate having a silicon oxide film interposed therebetween, i.e., the so-called SOI structure, is attracting much attention. As a break through for a device of low energy consumption, the study on an SOI structure is in a rapid progress.

Substantially, the monodomain region according to the present invention has a crystallinity well equivalent to that of a single crystal. Accordingly, it can be readily applied to a SOI technique. In the present invention, problems yet to be solved for an SOI substrate is considered in comparison with the present invention.

Figure 5:
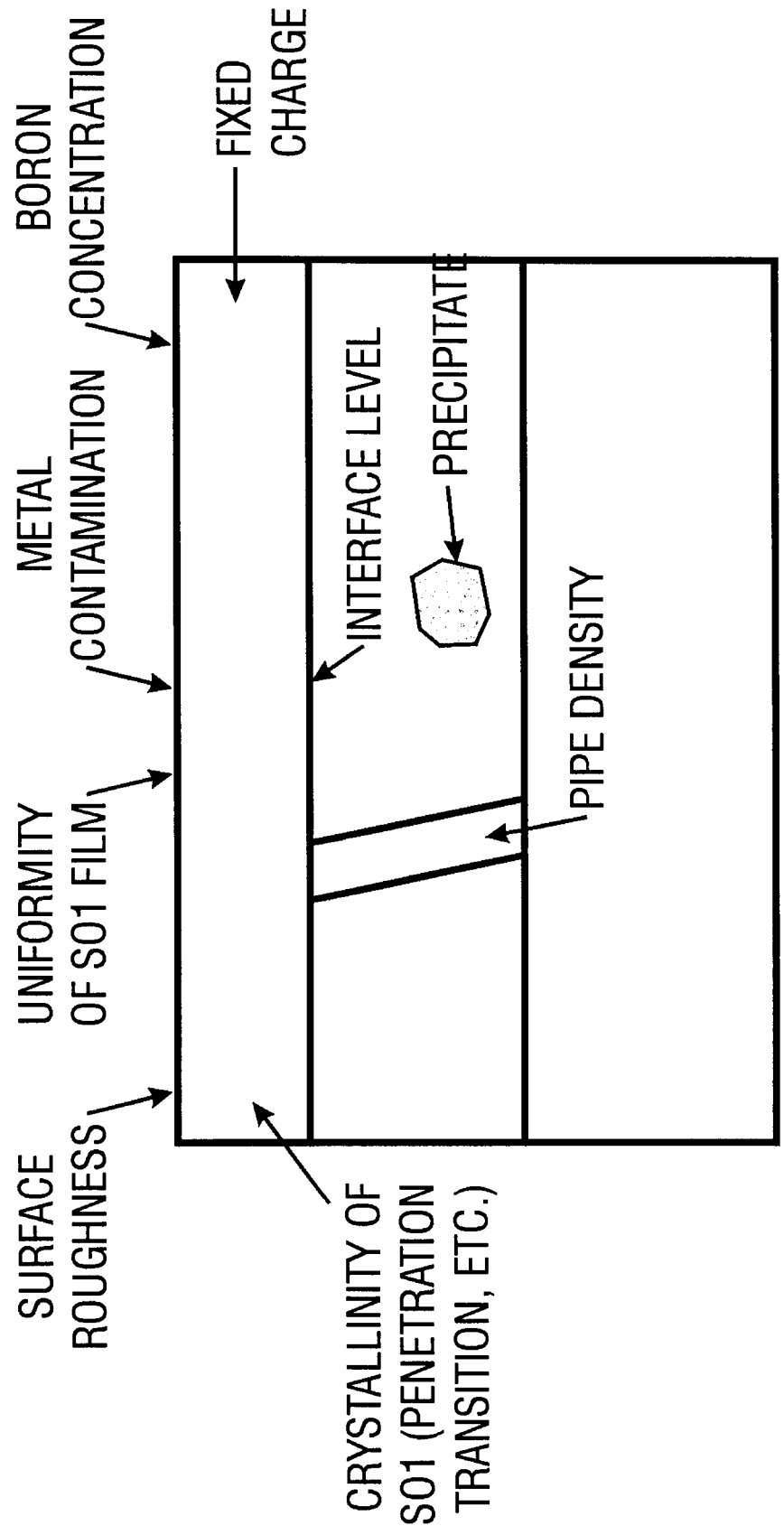
FIG. 5 is an explanatory figure showing the problems of SOI technique.

The problems remaining yet to be solved in the SOI technique are summarized in FIG. 5. Referring to FIG. 5, it can be seen that the problems include those related to crystallinity, such as the interface density level in the silicon film and fixed charges, and those attributed to external factors, such as metallic contamination and boron concentration.

In the present invention, a laser light or an intense light having an energy equivalent to that of a laser light is irradiated to the crystalline silicon film to improve the crystallinity and recombine crystals with each other (form single crystals).

Concerning the effect of the laser annealing, factors which unfavorably affect the crystallinity, such as the pipe density, interface density level, fixed charges, penetrating transition, etc., can be removed or considerably reduced.

Moreover, in case the precipitate shown in FIG. 5 is a silicide based substance, it can be easily molten and evaporated at the instant the laser light is irradiated thereto. In case it is an oxide based substance, the effect of the laser light which locally elevates the temperature as to cause the oxygen to undergo redissociation and diffusion can be expected. Therefore, an oxide can be eliminated.

Embodiment 5

The present embodiment refers to a constitution similar to that described in Embodiment 1, except that the concave or convex patterns formed on the silicon oxide film provided as the buffer layer are changed.

Instead of the square fine island-like patterns formed in Embodiment 1, rectangular groove-like patterns are formed in the present embodiment. Although concave portions are formed in the present embodiment, the same effect can be obtained by forming convex portions.

The crystallization step of the amorphous silicon film is omitted here because it is the same as is described in Embodiment 1. The shape of the crystal grains after the crystallization is shown in FIG. 6.

Figure 6:
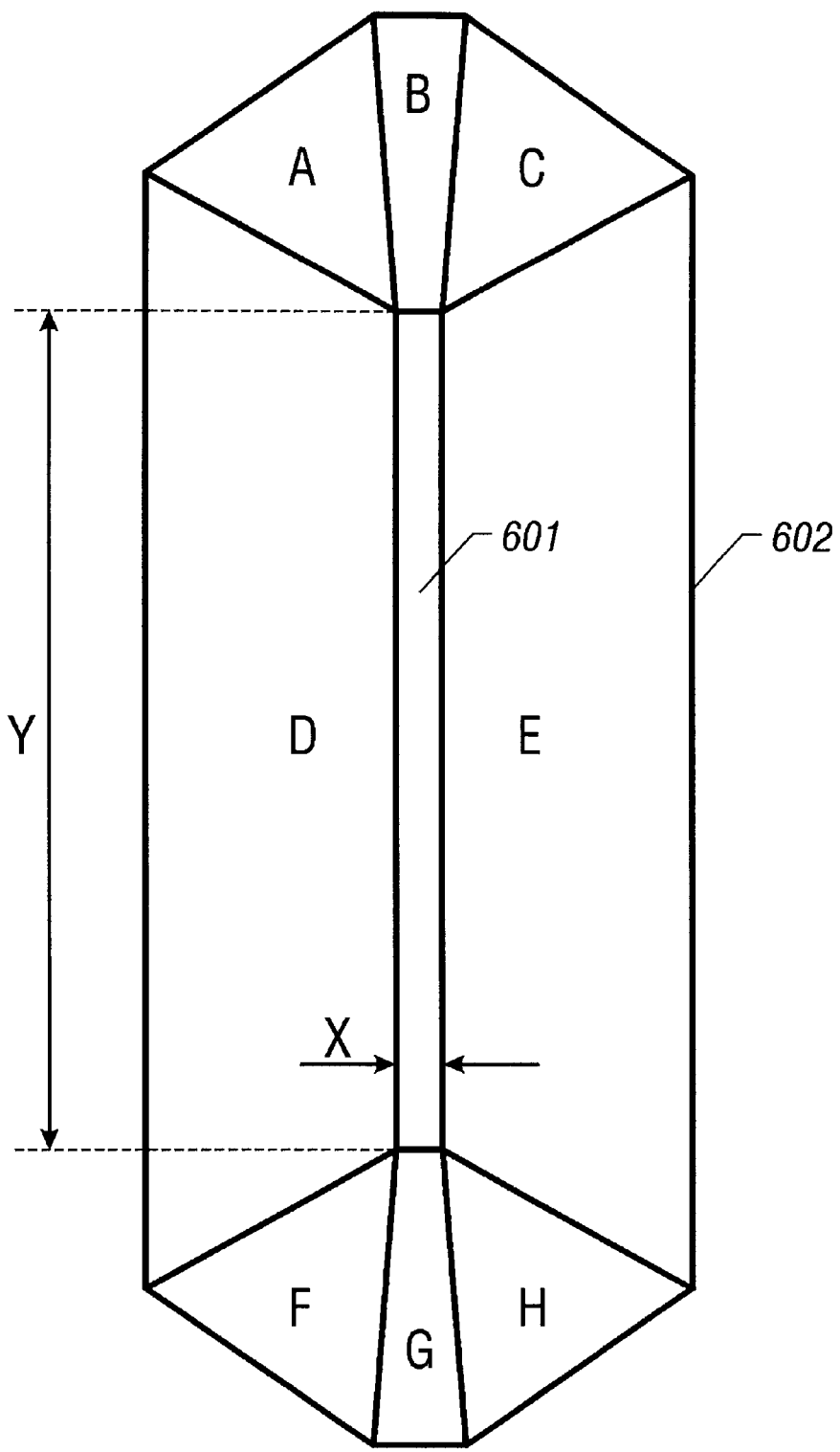
FIG. 6 shows the constitution of a monodomain region.

Referring to FIG. 6, lateral growth region 602 is formed from the vertical growth region 601 provided as the crystal nucleus. The present embodiment differs from Embodiment 1 in that the crystal nucleus is regarded as a line, and not as a point.

Thus, the resulting crystal grain exhibits an approximately elongated hexagonal shape. The lateral growth region 602 consists of eight regions A to H. However, because the vertical growth region 601 has a length Y sufficiently longer than the width X, the regions A to C and F to H becomes negligibly small compared with the regions D and E when the film is formed on a quartz substrate.

The advantage of forming the concave or convex pattern in the shape above is that the regions D and E become monodomain regions larger than those obtained in Embodiment 1. That is, by forming the active layer of a thin film transistor by using those regions alone, a plurality of active layers having the same crystallinity can be formed within a single monodomain.

Embodiment 6

The present embodiment refers to a constitution in which the TFT described in Embodiment 3 is used to form a CMOS structure. The manufacturing process steps of the present embodiment are shown in FIGS. 8 to 10. The crystalline silicon film formed by the present invention has a wide application range, and the method of forming a CMOS structure is not only limited to that described in the present embodiment.

First, in accordance with the constitution described in Embodiment 1, a silicon oxide film 32 is formed on a glass substrate 31, and a crystalline silicon film comprising a monodomain region is obtained thereon. By patterning the thus obtained crystalline silicon film, an active layer 33 and an active layer 34, both consisting of monodomain region alone, are obtained for the N-channel type TFT and the P-channel TFT, respectively.

After forming the active layers 33 and 34, a silicon oxide film 35 which functions as a gate insulating film is formed by means of plasma CVD. This film is formed at a thickness of from 500 to 2,000 Å, representatively, at a thickness in a range of from 1,000 to 1,500 Å. Furthermore, other insulating films such as a silicon oxynitride film or a silicon nitride film can be used as a gate insulating film in the place of the silicon oxide film.

Figure 8A:
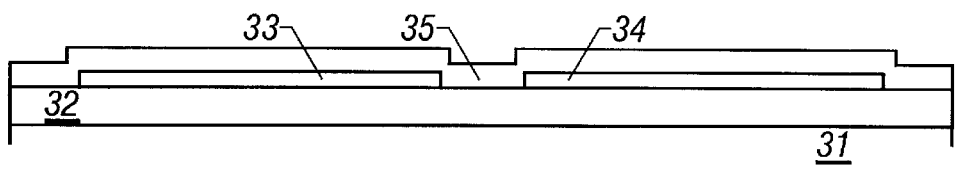
FIGS. 8(A) to 8(E) show the manufacturing process of a semiconductor device.

Thus is obtained a state as is illustrated in FIG. 8(A). To make the explanation simple, a case of forming a pair of N-channel type thin film transistor and P-channel type thin film transistor is described below. In general, a unit comprising several hundred or more of N-channel type thin film transistors and P-channel type thin film transistors is formed on a single glass substrate.

Figure 8B:
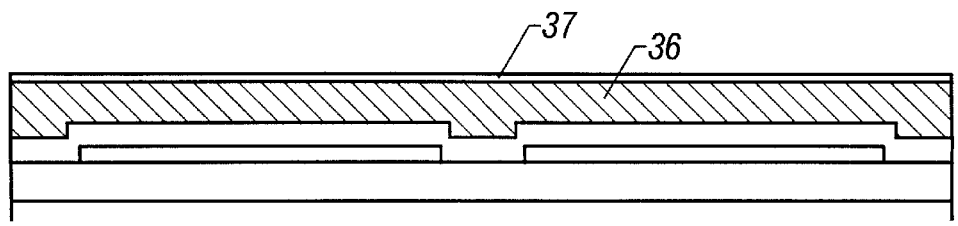
Figure 8C:
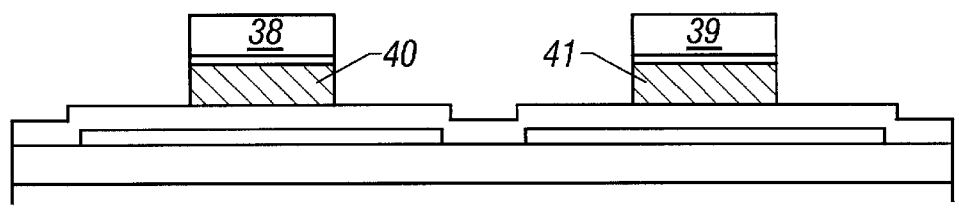

After the state shown in FIG. 8(A) is obtained, an aluminum film 36 which constitutes the gate electrodes 1 and 2 is formed as is shown in FIG. 8(B). Scandium is added at a concentration of 0.2% by weight into the aluminum film to suppress the generation of hillocks and whiskers. The aluminum film can be formed by methods such as sputtering and electron beam vapor deposition.

Hillocks and whiskers are prickle-like or needle-like protrusions attributed to the abnormal growth of aluminum. Hillocks and whiskers cause short circuit and cross talk between the adjacent wirings or the spaced wirings.

Other anodically oxidizable metals such as tantalum can be used in place of an aluminum film.

After an aluminum film 36 is formed, a thin, dense anodic oxide film 37 is formed by performing anodic oxidation in an electrolytic solution using the aluminum film 36 as the anode.

In the present embodiment, an ethylene glycol solution containing 3% of tartaric acid and neutralized by ammonia is used as the electrolytic solution. A dense anodic oxide film can be obtained by using the present anodic oxidation method. The film thickness can be controlled by the applied voltage.

In the present embodiment, the anodic oxide film 37 is formed at a thickness of about 100 Å. The anodic oxide film 37 increases the adhesiveness to the resist mask that is formed in the later step. Thus is obtained a state as is shown in FIG. 8(B).

Then, resist masks 38 and 39 are formed. By using the resist masks 38 and 39, the aluminum film 36 and the anodic oxide film 37 provided on the surface thereof are patterned to form patterns 40 and 41 (FIG. 8(C)).

Then, anodic oxidation is performed by using a 3% aqueous oxalic solution as the electrolytic solution and the residual aluminum film patterns 40 and 41 as the anodes.

In this step of anodic oxidation, the anodic oxidation proceeds selectively on the side surfaces of the residual aluminum film patterns 40 and 41. This is because a dense anodic oxide film and the resist masks 38 and 39 remain on the upper surface of the aluminum film patterns 40 and 41.

Porous anodic oxide films 42 and 43 are formed by the present anodic oxidation step. The porous anodic oxide films 42 and 43 may be formed to a thickness of about several micrometers.

Figure 8D:
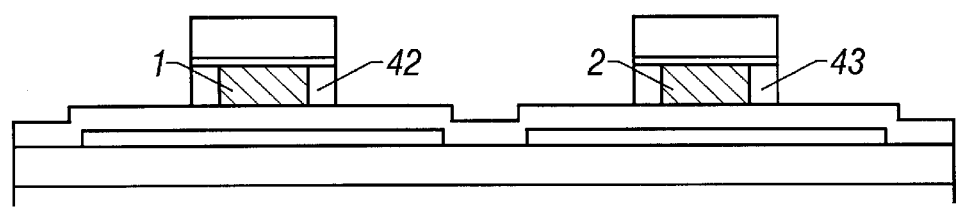

In the present embodiment, the distance of progressive anodic oxidation, which corresponds to the film thickness, is 7,000 Å. The length of the low density impurity region, which is to be established later, depends on this distance of progressive anodic oxidation. By experience, the growth distance of the porous anodic oxide films 42 and 43 is preferably in a range of from 6,000 to 8,000 Å. Thus is obtained a state as is shown in FIG. 8(D).

The gate electrodes 1 and 2 are established at this stage. The resist masks 38 and 39 are removed after the state shown in FIG. 8(D) is realized.

Anodic oxidation is performed again by using an ethylene glycol solution containing 3% of tartaric acid and neutralized by ammonia as the electrolytic solution. In this step, the electrolytic solution intrudes into the porous anodic oxide films 42 and 43. Dense anodic oxide films 44 and 45 as are shown in FIG. 8(E) are obtained as a result.

The thickness of the dense anodic oxide films 44 and 45 is in a range of from 500 to 4,000 Å. The film thickness thereof is controlled by changing the duration of applying the voltage. The residual portion of the dense anodic oxide film 37 formed previously is integrated with the anodic oxide films 44 and 45.

Figure 8E:
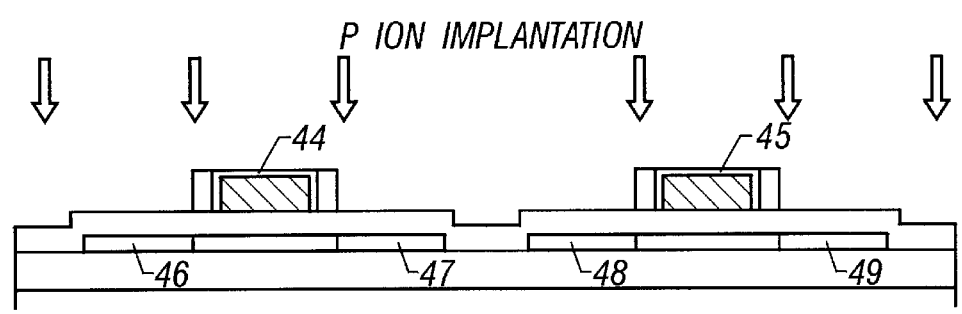

Referring to FIG. 8(E), P (phosphorus) ions are doped into the entire surface as impurity ions which render the structure N-type conductive.

The doping in this stage is effected at a high dose of $0.2-5\times10^{15}/cm^2$, preferably, $1-2\times10^{15}/cm^2$. Plasma doping or ion doping is used for the method.

Regions 46, 47, 48, and 49, which are heavily implanted with P ions, are formed as a result of the step shown in FIG. 8(E).

The porous anodic oxide films 42 and 43 are removed thereafter by using an aluminum mixed acid. In this case, the active layer region positioned just under the anodic oxide films 42 and 43 is substantially intrinsic because no ions are implanted therein.

Then, a resist mask 50 is formed in such a manner that the element constituting the P-channel type thin film transistor on the right side is covered thereby. Thus is obtained a state shown in FIG. 9(A).

Figure 9A:
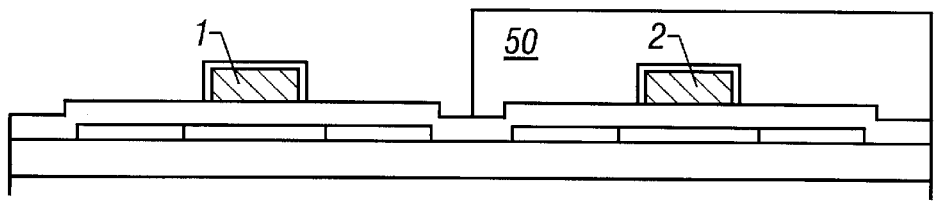
FIGS. 9(A) to 9(D) show the manufacturing process of a semiconductor device.
Figure 9B:
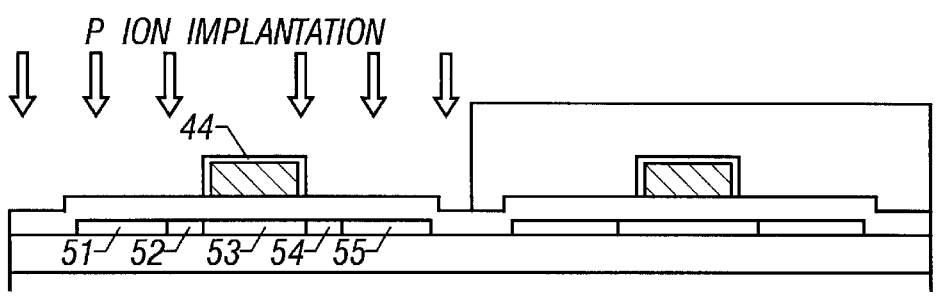

After the state shown in FIG. 9(A) is obtained, P ions are implanted again as is shown in FIG. 9(B). The implantation of the P ions is performed at a low dose of $0.1-5\times10^{14}/cm^2$, preferably, $0.3-1\times10^{14}/cm^2$.

That is, the dose of P ions in the implantation performed in the step shown in FIG. 9(B) is controlled to he lower than that in the implantation of the step shown in FIG. 8(E).

Thus, lightly doped regions 52 and 54 become the low density impurity regions. The regions 51 and 55 are the high density impurity regions in which P ions are implanted at a higher density.

By performing this step, the region 51 becomes the source region for the N-channel type thin film transistor. Regions 52 and 54 are the low density impurity regions, and the region 55 is the drain region. The region 53 is a substantially intrinsic channel forming region. The low density impurity region 54 is the commonly known LDD (lightly doped drain) region.

Although not shown specifically in the figure, the region shielded by the anodic oxide film 44 from the ion implantation is present between the channel forming region 53 and the low density impurity regions 52 and 54. This region is denoted as an offset gate region, and is extended for a distance corresponding to the film thickness of the anodic oxide film 44.

The offset gate region is substantially intrinsic because no ions are implanted therein, but it neither forms a channel because no gate voltage is applied thereto. Thus, it functions as a resistor which relaxes the electric field intensity and suppresses degradation. However, it does not function as an effective offset gate region in case the distance (the offset gate width) thereof is short. Furthermore, there is no clear boundary in the distance which tells the limit of effective function.

Figure 9C:
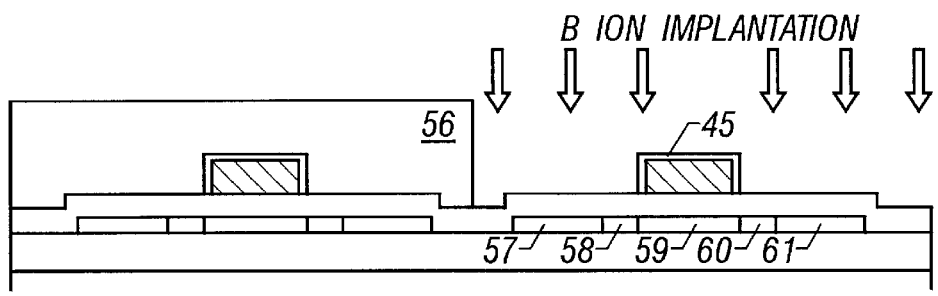

Then, the resist mask 50 is removed to form a resist mask 56 covering the N-channel type thin film transistor on the left side as is shown in FIG. 9(C).

Referring to FIG. 9(C), B (boron) ions are implanted as impurities which impart P-type conductivity. The dose of the B ions in the present embodiment is about $0.2-10\times10^{15}/cm^2$, preferably, $1-2\times10^{15}/cm^2$. The dose of B ions in FIG. 9 (C) is higher than that of P ions in FIG. 8(E).

The regions 57 and 61 formed in the present step contain impurities which impart an N-type or a P-type conductivity, but they only function substantially as pads (hereinafter referred to as "contact pads") for making contact with the take out electrodes. More specifically, differing from the N-channel type thin film transistor on the left side, the regions 57 and 61 are clearly distinguished from source/drain.

The present inventors define, with respect to the P-channel type thin film transistor, the region 58 as the source region and the region 60 as the drain region.

The regions 58 and 60 are formed by implanting B ions alone into the substantially intrinsic region. Accordingly, because no ions other than B is present, the impurity concentration can be easily controlled so as to realize a well-aligned PI junction. Furthermore, disordering in crystallinity attributed to ion implantation can be suppressed to a relatively low level.

An offset gate region can be formed by using the anodic oxide film 45. However, it is known by experience that the P-channel type thin film transistor hardly undergoes degradation. Accordingly, it is not necessary in particular to provide an offset gate region.

A source region 58 and a drain region 60 for the P-channel type thin film transistor are formed in this manner. The region 59 becomes a channel forming region because no impurity in particular is implanted therein. As is described hereinbefore, contact pads 57 and 61 are established to take-out electric current respectively from the source region 58 and the drain region 60.

Figure 9D:
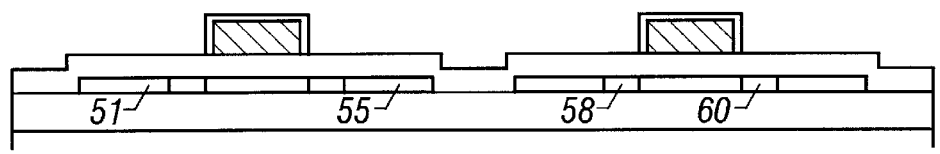

Upon completion of the step shown in FIG. 9(C), the resist mask 56 is removed to obtain the state shown in FIG. 9(D). Laser light is irradiated thereafter for the activation of the implanted impurities and for the annealing of the regions into which the impurity ions are implanted.

Thus, the irradiation of laser light is effected on the regions shown by the pair of source/drain regions 51 and 55 of the N-type thin film transistor and the pair of source/drain regions 58 and 60 of the P-type thin film transistor while there is no much difference in crystallinity.

There is no great difference in crystallinity between the two regions in the step shown in FIG. 9(C) because the source/drain regions 58 and 60 of the P-channel type thin film transistor are not greatly damaged by the ion implantation.

Thus, in case of annealing the source/drain regions of the two thin film transistors by irradiating a laser light in the state shown in FIG. 9(D), the difference in annealing effect can be corrected. That is, the difference in characteristics can be corrected for the N- and P-channel type thin film transistors.

Figure 10A:
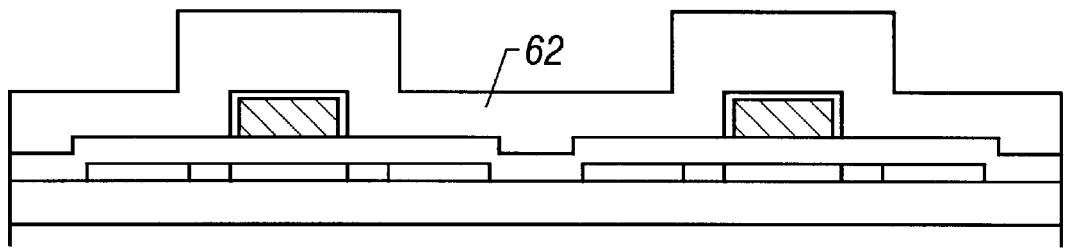
FIGS. 10(A) and 10(B) show the manufacturing process of a semiconductor device.
Figure 10B:
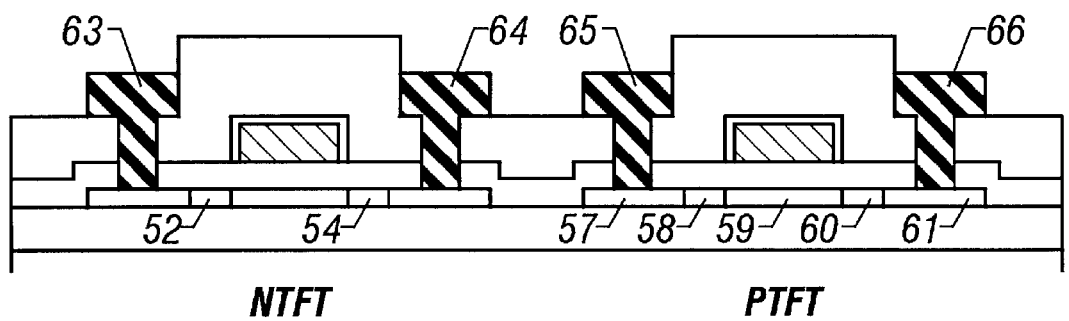

Once a stage as shown in FIG. 9(D) is obtained, a 4,000-Å-thick interlayer insulating film 62 is formed as is shown in FIG. 10(A). The interlayer insulating film 62 may be a silicon oxide film, a silicon oxynitride film, or a silicon nitride film. Otherwise, it may have a multilayered structure. The silicide films can be formed by means of plasma CVD or thermal CVD.

Then, after forming contact holes, a source electrode 63 and a drain electrode 64 for the N-channel thin film transistor (NTFT) are formed. A source electrode 65 and a drain electrode 66 for the P-channel thin film transistor (PTFT) are also formed simultaneously (FIG. 10(B)).

Patterning is performed thereafter in such a manner that the drain electrode 64 of the N-channel type thin film transistor may be connected with the drain electrode 66 of the P-channel type thin film transistor. By further connecting the gate electrodes of two TFTs with each other, a CMOS structure can be implemented.

A thin film circuit of a CMOS type as in the present embodiment can be employed in an active matrix type liquid crystal display device and an active matrix type EL display device.

In the impurity ion implantation steps shown in FIGS. 8(E), 9(B), and 9(C), it is important that the active layer is covered by a silicon oxide film 35 constituting the gate insulating film.

By performing implantation of impurity ions in this state, surface roughening and contamination of the active layer can be suppressed. This greatly contributes to an increase in production yield and in reliability of the device.

Embodiment 7

The present embodiment refers to a constitution in which the crystalline silicon film described in Embodiment 1 is formed on a silicon wafer. It is necessary to provide an insulating layer on the surface of the silicon wafer, and, in general, a thermal oxidation film is used therefor.

The heat treatment is generally conducted in a temperature range of from 700 to 1,300° C., and the period of time for the treatment varies depending on the desired oxide film thickness.

The thermal oxidation of a silicon wafer is generally performed under an atmosphere of $O_2$, $O_2$—$H_2O$, $H_2O$, or combusted $O_2$—$H_2$. Oxidation under an atmosphere into which a halogen element such as HCl or $Cl_2$ is added is also put widely into practice.

A silicon wafer is one of the substrates indispensable for a semiconductor device such as an IC. Various techniques for forming a variety of semiconductor elements on the wafer have been developed.

By utilizing the present embodiment, the application range of a crystalline silicon film can be further extended by combining the crystalline silicon film having a crystallinity well equivalent to that of a single crystal with a conventional technique using silicon wafers.

Embodiment 8

The present embodiment refers to a specific constitution with reference to Embodiment 7, in which a TFT utilizing the crystalline silicon film according to the present invention is formed on an IC being formed on a silicon wafer. The manufacturing process is described schematically with reference to FIGS. 11(A) to 11(D).

Figure 11A:
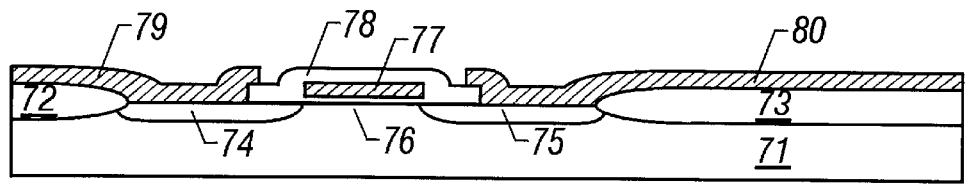
FIGS. 11(A) to 11(D) show the manufacturing process of a semiconductor device.

FIG. 11(A) shows a MOS-FET formed on a silicon wafer by an ordinary process. It comprises a silicon substrate 71, and insulating films 72 and 73, which are generally thermally oxidized films, for isolating the elements from each other. A source region 74 and a drain region 75 are formed by diffusion process after implanting impurity ions into the silicon substrate 71 to render it conductive. Thus, in case the silicon substrate 71 is P-type, an impurity for rendering it N-type conductive, i.e., phosphorus, is implanted. Reversely, if the silicon substrate 71 is N-type, an impurity for rendering it P-type conductive, i.e., boron, is implanted.

The region 76 is a channel forming region. In this region, a part of the thermal oxidation film that is formed in the diffusion process after the ion implantation is left over on the surface of silicon by controlling the film thickness, so that it may function as a gate insulating film. A polycrystalline silicon film having a single conductive type is used for a gate electrode 77.

The gate electrode 77 is covered by an insulating film 78 such as silicon oxide film in such a constitution that it may not form an electric short circuit with the source electrode 79 and the drain electrode 80 (FIG. 11(A)).

After the state shown in FIG. 11(A) is obtained, an interlayer insulating film 81 is formed. A silicon oxide film, a silicon nitride film, etc., is used for the interlayer insulating film. After forming the interlayer insulating film 81, a contact hole is formed to provide a take out wiring 82 to the drain electrode (FIG. 11(B)).

Figure 11B:
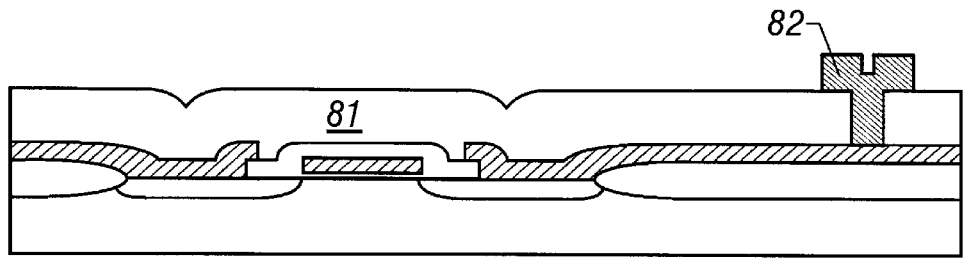

Then, polishing is effected after the state shown in FIG. 11(B) is obtained. That is, the exposed surface is planarized by means of CMP (chemical mechanical polishing) technique. Thus is obtained a planarized interlayer insulating film 81, and the convex portion of the take out wiring 82 is removed.

Figure 11C:
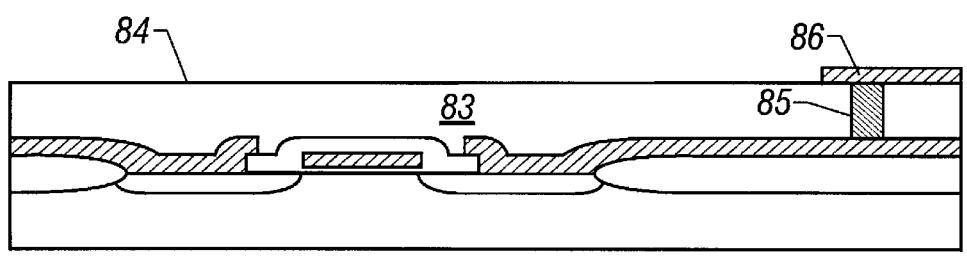

In FIG. 11(C), a planarized surface 84 is provided on the planarized interlayer insulating film 83. A convex portion is no longer observed on take out wiring 85, and another take out wiring 86 is formed in connection therewith.

An interlayer insulating film 87 is formed thereafter. The present invention is applicable to the interlayer insulating film 87. That is, a thin film transistor using the monodomain region for the active layer is formed on the interlayer insulating film 97.

Firstly, in accordance with Embodiment 1, an active layer 88 is formed by using a the monodomain region. A gate insulating film 89 is formed thereafter, and a gate electrode 90 is formed subsequent thereto. Then, an impurity for imparting a single conductive type to the active layer is implanted.

After completion of the impurity implantation, a side wall 91 is formed to provide a low density impurity region in the later steps. A side wall 91 can be formed as follows.

By using a silicon oxide film and the like, an insulating film (not show in the figure) which covers the gate electrode 90 is formed to a thickness not less than the film thickness of the gate electrode 90. Then, anisotropic etching is effected by means of dry etching to remove the thus deposited insulating film. Thus, the insulating film remains only on the side surfaces of the gate electrode 90 to provide a side wall 91.

Impurity implantation is performed again in this state. The regions implanted with an impurity in the second time become a source region and a drain region, and the region shielded with the side wall 91 provides an impurity region containing the impurity at a density lower than that in the source and drain regions. The impurity thus incorporated is activated thereafter by, for example, applying heat treatment or irradiating a laser light.

In the manner above, a silicon oxide film or a silicon nitride film is formed as an interlayer insulating film 92 after the active layer is constructed. Then, after forming contact holes, a source electrode 93 and a drain electrode 94 are also formed.

Figure 11D:
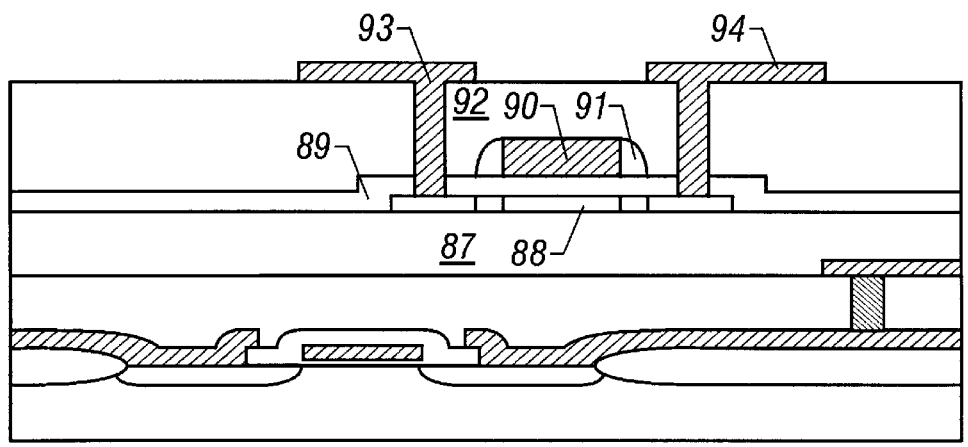

As is described in the present embodiment, an integrated circuit having a three-dimensional structure as is illustrated in FIG. 11(D) can be implemented by applying the present invention to an IC. Because the TFT formed on the upper side of the IC according to the present invention yields a performance well equivalent to that of a TFT formed on a single crystal, the performance of the original IC remains without being impaired so as to make it feasible an integrated circuit at a ever higher integration density.

Embodiment 9

The present embodiment refers to a constitution in which a TFT manufactured by applying the present invention is employed in a DRAM (dynamic random access memory). The explanation is made with reference to FIGS. 12(A) and 12(B).

Figure 12A:
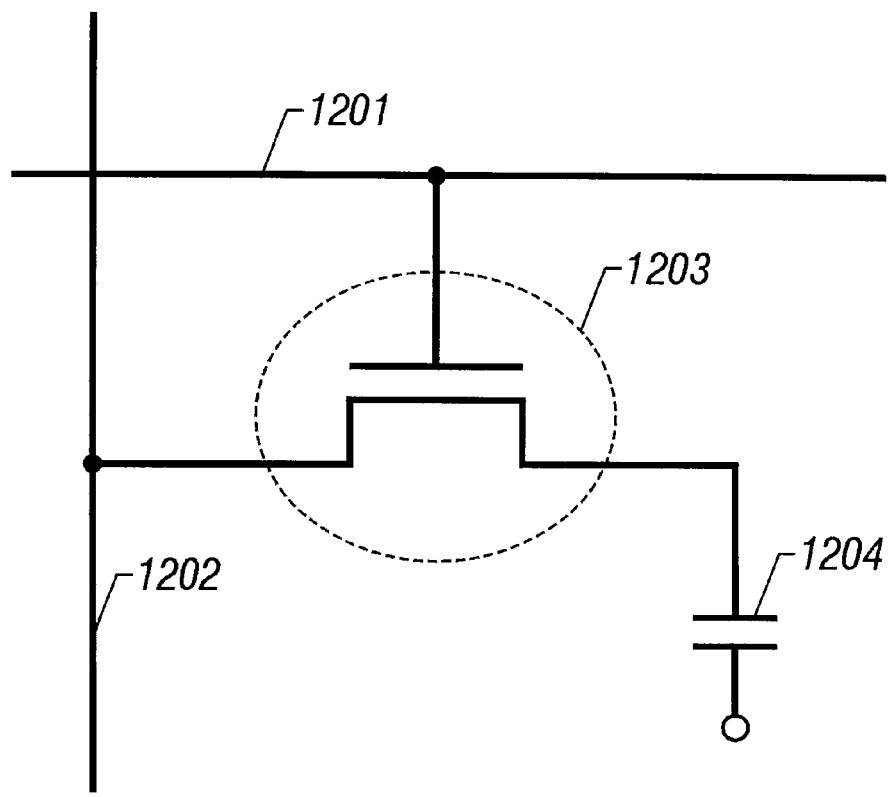
FIGS. 12(A) and 12(B) show the constitution of a DRAM.

A DRAM is a memory in which the information to be recorded is stored as a charge in a capacitor. The pieces of information in the form of charges are input and output into the capacitor under control of a TFT serial connected to the capacitor. The circuit comprising a TFT and a capacitor which constitutes a single memory cell of a DRAM is shown in FIG. 12(A).

When a gate signal is provided through a word line 1201, the TFT 1203 assumes a conducting state. In this state, the capacitor 1204 is charged from the bit line 1202 side to write information, or the charged capacitor is discharged to read information.

Figure 12B:
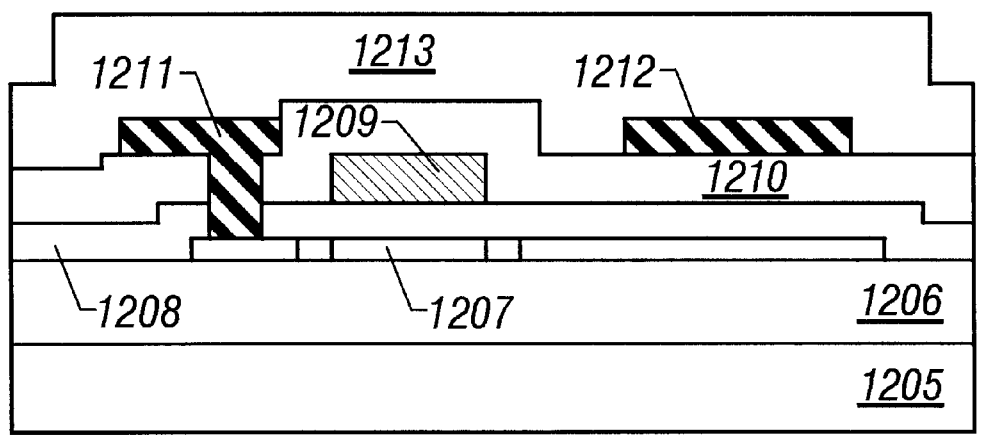

The cross section structure of a DRAM is shown in FIG. 12(B). A base body 1205 is made of a quartz substrate or a silicon substrate. A so-called SOI structure can be implemented if a silicon substrate is used.

A silicon oxide film 1206 is formed as a base film on the base body 1205, and a TFT is formed thereon by applying the present invention. If the base body 1205 is a silicon substrate, a thermal oxidation film can be used as the base film 1206. An active layer 1207 consisting of a monodomain region formed in accordance with Embodiment 1 is also provided.

The active layer 1207 is covered by a gate insulating film 1208, and a gate electrode 1209 is formed thereon. After laminating an interlayer insulating film 1210 thereon, a source electrode 1211 is formed. A bit line 1202 and an electrode 1212 are formed simultaneously with the formation of the Source electrode 1211. A protective film 1213 comprising an insulating film is also provided.

The electrode 1212 maintains a fixed potential to thereby form a capacitor 1214 between the electrode 1212 and the drain region of the active layer located below the electrode 1212. That is, the memory element functions by writing or reading out the charge accumulated in the capacitor by a TFT.

A DRAM is characterized in that a single memory can be implemented by extremely few number or elements, i.e., a TFT and a capacitor. Thus, it is suitable for constructing a large scale memory with high integration density. Moreover, it is utilized in largest quantity at present because the price thereof can be suppressed to a low level.

For instance, in case an SOI structure is formed on a silicon substrate by applying the present invention, the leak current of the TFT can be minimized, because the junction area is small. This greatly contributes to the duration time of data retention.

Furthermore, a DRAM cell formed on a SOI substrate is also characterized in that it enables operation at a low voltage, because the capacity can be set at a low value.

Embodiment 10

The present embodiment refers to a constitution in which a TFT manufactured by applying the present invention is employed in a SRAM (static random access memory). The explanation is made with reference to FIGS. 13(A) and 13(B).

A SRAM is a memory which utilizes a bistable circuit such as a flip-flop for the memory element, and binary information values (0 or 1) are recorded in correspondence with the bistable states, i.e., ON-OFF or OFF-ON, of the bistable circuit. This memory is advantageous in that it retains the memory so long as an electric power is supplied.

Figure 13A:
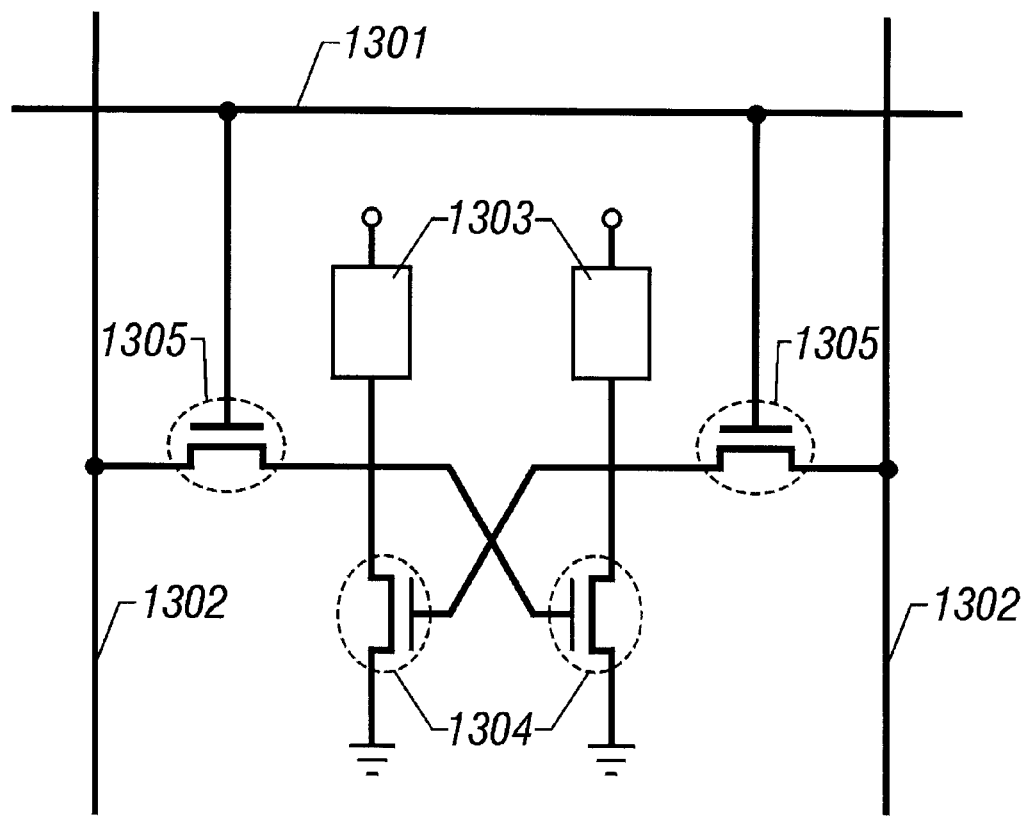
FIGS. 13(A) and 13(B) show the constitution of an SRAM.

The memory circuit is constructed by an N-MOS or a C-MOS. The SRAM shown in FIG. 13(A) is a circuit comprising a high resistance for the passive load element.

A word line 1301 and a bit line 1302 are provided in the constitution. A load element 1303 is constructed from a high resistance. Two pairs of driver transistors 1304 and two pairs of access transistors 1305 constitute the SRAM.

Figure 13B:
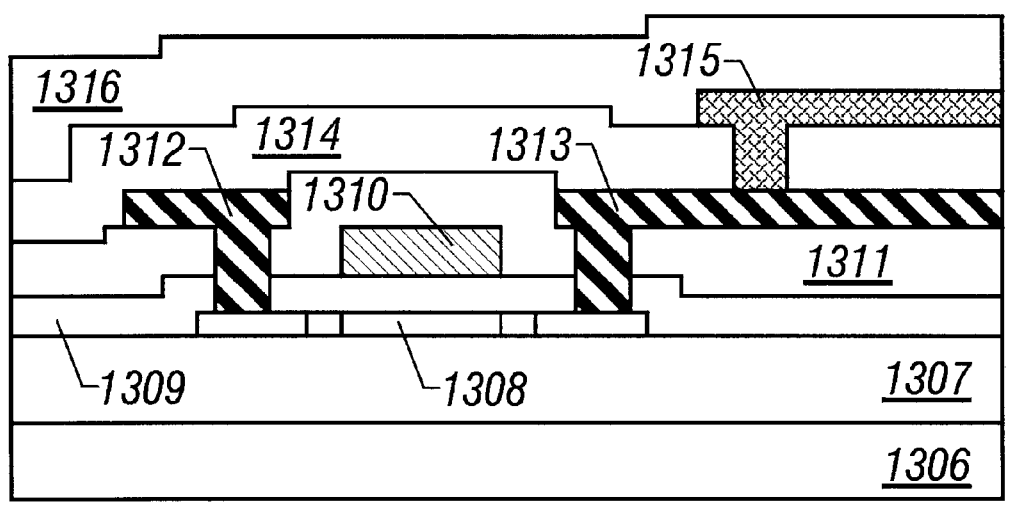

The cross section structure of the TFT is shown in FIG. 13(B). A substrate 1306 is made of a quartz substrate or a silicon substrate. A silicon oxide film 1307 is formed as a base film on the substrate 1306, and a TFT is formed thereon by applying the present invention. An active layer 1308 consisting of a monodomain region formed in accordance with Embodiment 1 is also provided.

The active layer 1308 is covered by a gate insulating film 1309, and a gate electrode 1310 is formed thereon. After laminating an interlayer insulating film 1311 thereon, a source electrode 1312 is formed. A bit line 1302 and a drain electrode 1313 are formed simultaneously with the formation of the source electrode 1312.

An interlayer insulating film 1314 is formed again on the structure, and a polysilicon film 1315 is formed as a high resistance load. A protective film 1316 comprising an insulating film is also provided.

The SRAM obtained with the constitution above is capable of high speed operation, is highly reliable, and can be readily embedded into systems.

Embodiment 11

The present embodiment refers to a constitution in which an active matrix region and a peripheral drive circuit for driving the active matrix region are integrated on a same based body by using a semiconductor device according to Embodiment 3 and a CMOS structure described in Embodiment 6.

One base body constituting an integrated liquid crystal display device of an active matrix type is constructed as follows. More specifically, in the active matrix region, at least one thin film transistor for switching is provided to each of the pixels arranged in a matrix, and a peripheral circuit for driving the active matrix region is provided in the periphery of the active matrix region. These circuits are all integrated on a single glass substrate (or a quartz substrate or a silicon substrate).

By applying the present invention to the constitution above, an active matrix region and a peripheral circuit can be constructed by a thin film transistor having a performance well equivalent to that of a MOS-FET formed on a single crystal.

That is, the pixel TFT for the active matrix region is constructed with a thin film transistor shown in FIG. 4(E) while constructing the peripheral circuit with a CMOS constitution shown in FIGS. 8 to 10.

It is desired that the OFF current value of the thin film transistor provided to the active matrix region is suppressed as low as possible because the charge retained in the pixel electrode must be held for a predetermined duration time of time.

Because the thin film transistor according to the present invention comprises an active layer consisting of a monodomain region, there is substantially no grain boundary that provides a path (current path) through which the off current flows preferentially. Accordingly, a thin film transistor having a small OFF current can be provided.

On the other hand, CMOS circuits are widely used for the peripheral drive circuit. To obtain a CMOS circuit with high performance, the characteristics of the N-channel type and P-channel type transistors constituting the CMOS circuit must be made uniform as much as possible.

A CMOS structure described in Embodiment 6 with reference to FIGS. 8 to 10 is most suitable for achieving the above object.

An integrated active matrix type liquid crystal device can be thus implemented by a constitution comprising circuits each provided with the most favorable characteristics.

Embodiment 12

The present invention refers to a constitution similar to that described in Embodiment 3, except that the gate insulating film is formed in a different step.

First, a thin film semiconductor comprising the monodomain region is formed through a process similar to that described in Embodiment 1, and an active layer for the semiconductor device is formed by selectively utilizing the monodomain region alone.

Then, an insulating film (a silicon oxide film in the present embodiment) containing silicon as a main component thereof is formed by means of a vapor phase process represented by a CVD or a PVD process at a thickness of from 200 to 1,500 Å (800 Å in the present embodiment), in such a manner that it covers the active layer. The film thickness of the silicon oxide film is determined by taking the final withstand insulating voltage into consideration. A silicon oxynitride film or a silicon nitride film may be used in the place of the silicon oxide film.

Heat treatment in an atmosphere containing a halogen element is performed upon completion of the formation of the silicon oxide film. The main object of the heat treatment is to remove the metal residues, such as nickel, remaining inside the active layer by gettering. The heat treatment may be performed in a temperature range of from 600 to 1,100° C., but to sufficiently obtain the effect of gettering, it is preferably conducted at a temperature exceeding 700° C. (preferably in a range of 800 to 1,000° C.).

In case a glass substrate is used as the substrate, the heat treatment above must be performed in a temperature range of 600 to 650° C. by taking the heat resistance of the substrate into consideration. In case a material having high heat resistance is used for the substrate, such as a quartz substrate, the upper limit of the heating temperature can be elevated to about 1,100° C. (preferably 1,000° C.).

In the present embodiment, the heat treatment is effected on a quartz substrate and in a gaseous oxygen atmosphere into which 0.5 to 10% (3% in the present embodiment) of hydrogen chloride (HCl) is added. If the concentration of HCl should be higher than the range above, the surface of the crystalline silicon film will be roughened. In the present embodiment, the heat treatment is performed at a temperature of 950° C. for 0.5 hours.

To prepare an atmosphere containing a halogen element, at least one or a plurality of gaseous elements selected from the group consisting of HCl, HF, HBr, $Cl_2$, $NF_3$, $F_2$, and $Br_2$ are added into an oxygen atmosphere.

As a result of the step above, the gettering function of the halogen element works on the metallic element, and the nickel concentration inside the active layer is thus lowered by gettering to a level of $1 \times 10^{17}$ atoms/cm$^3$ or lower (preferably $1 \times 10^{16}$ atoms/cm$^3$ or lower, and more preferably, at a spin density or lower). The above concentration is an observed value obtained by SIMS (secondary ion mass spectroscopy).

A thermal oxidation reaction proceeds and a thermal oxide film about 200 Å in thickness is formed thereby at the interface between the active layer and the silicon oxide film. The OFF current can be effectively lowered by setting the final film thickness of the active layer to be in a range of 200 to 300 Å (representatively 250 Å).

In the present embodiment, an additional heat treatment is performed under a gaseous nitrogen atmosphere at 950° C. for 1 hour is effected after the above heat treatment using an atmosphere containing a halogen element. In this manner, the film quality of the thermal oxidation film and the insulating film containing silicon is improved.

Nickel is believed to be segregated in the grain boundary of the crystalline silicon film constituting the active layer. Thus, a plurality of dangling bonds generate by removing nickel therefrom. The plurality of dangling bonds undergo recombination by the heat treatment at 950° C. to form a grain boundary reduced in the density of trap levels.

As a result of the heat treatment performed in an atmosphere containing a halogen element, residual halogen element remains at a high concentration in the vicinity of the interface between the active layer and the gate insulating film. According to the results of SIMS, halogen elements remain at a concentration of $1 \times 10^{19}$ to $1 \times 10^{20}$ atoms/cm$^3$.

The thermal oxidation film formed at the interface between the active layer and the silicon oxide film above constitute the gate insulating film together with the aforementioned silicon oxide film. Because the defect levels, the interlattice silicon atoms, etc., are reduced at the interface of the active layer, an extremely superior interface state is obtained at the interface between the active layer and the gate insulating film.

As described above, the concentration of metallic elements such as nickel can be lowered by performing the heat treatment according to the present embodiment. From the viewpoint of improving the reliability of a semiconductor device, it is very important for a semiconductor device to reduce the concentration of a metallic element such as nickel. A gate insulating film having a favorable interface state can be formed by improving the crystalline state of the active layer.

As described above, a semiconductor device having excellent electric properties and a high reliability can be implemented.

Embodiment 13

The present invention refers to a constitution in which the interface state between the active layer and the gate insulating film is improved. In particular, the present technique is effective in case a glass substrate is used.

First, a thin film semiconductor comprising the monodomain region is formed through a process similar to that described in Embodiment 1, and an active layer for the semiconductor device is formed by selectively utilizing the monodomain region alone. Then, in the same manner as in Embodiment 12, a silicon oxide film is formed by means of CVD or PVD process at a thickness of from 200 to 1,500 Å.

Heat treatment is then performed in a temperature range of from 500 to 700° C. (representatively, at 640 to 650° C.). This temperature range is set so that a thermal oxide film can be formed without generating any deformation or warping on the glass substrate. The heat treatment may be performed in an atmosphere containing oxygen alone, or in an atmosphere containing a halogen atom. It is also possible to use a wet atmosphere containing water vapor.

In case of performing a heat treatment under the conditions of the present embodiment, a thermal oxidation film less than several tens of angstroms (Å), for instance, 10 to 90 Å, can be formed by applying the treatment for a duration of about 0.5 to 2 hours. The growth of the thermal oxidation film does not proceed any more after the film thickness attains the saturated value above.

According to the knowledge of the present inventors, fixed charges, the density of defect levels, etc., concentrate in the very vicinity of the interface between the active layer and the gate insulating film (i.e., a region about 10 to 30 Å in length as measured from the interface to the active layer side and the gate insulating film side). Accordingly, it cannot be exaggerated that this region determines the interface state between the active layer and the gate insulating film.

Thus, to attain a favorable state at the interface between the active layer and the gate insulating film, it is necessary to only remove the fixed charges, the density of defect levels, etc., by thermally oxidizing merely the region of 10 to 30 Å in width at the interface of the active layer (the thickness of the active layer reduces by 10 to 30 Å, while newly developing a 20 to 60 Å thick thermal oxidation film). In other words, a favorable interface state can be realized by merely forming a thermal oxidation film less than about several tens of angstroms (Å) in thickness.

By thus incorporating the thermal oxidation step of the present embodiment, a semiconductor device having an excellent performance can be manufactured on a substrate having a poor heat resistance, such as a glass substrate.

Embodiment 14

The present embodiment refers to a constitution in which a crystalline silicon film (polysilicon film) is used as the gate electrode. The explanation is made with reference to FIGS. 15(A) to 15(D).

Figure 15A:
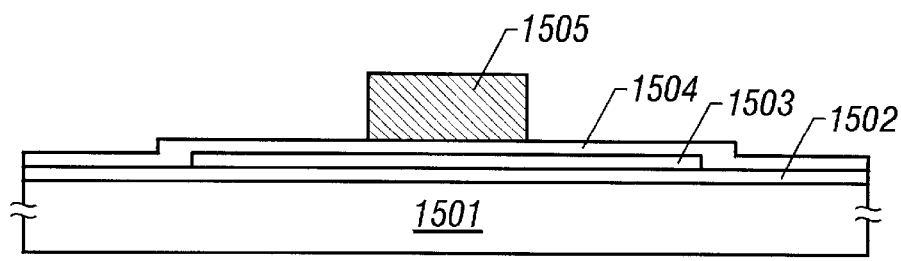
FIGS. 15(A) to 15(D) show the manufacturing process of a semiconductor device.

Referring to FIG. 15(A), the structure comprises a glass substrate 1501, a base film 1502, an active layer 1503 comprising a monodomain region obtained by the process described in Embodiment 1, a gate insulating film 1504, and a gate electrode 1505 comprising a polysilicon film imparted with a monoconductive type.

Then, impurity ions for imparting a monoconductive type to the active layer 1503 are imparted. Impurity regions 1506 and 1507 are formed by the impurity implantation step in this manner.

Upon the completion of the implantation of impurity ions, a 0.5 to 1 $\mu$m thick silicon nitride film 1508 is formed. The film can be formed by any method selected from low pressure thermal CVD, plasma CVD, and sputtering. A silicon oxide film can be used instead of the silicon nitride film.

Figure 15B:
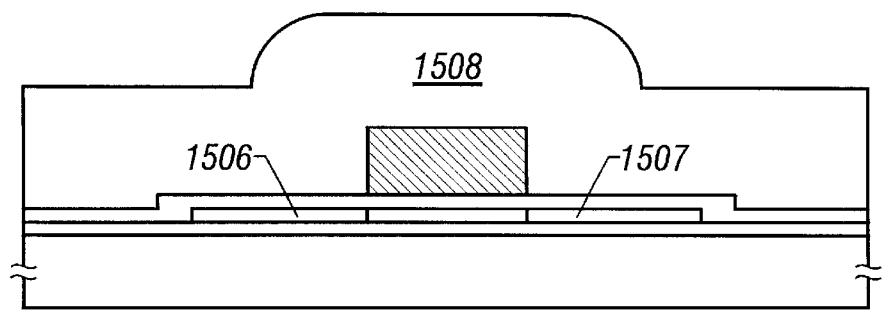

Thus is obtained a state as is shown in FIG. 15(B). Once the state illustrated in FIG. 15(B) is obtained, the silicon nitride film 1508 is etched by means of etch-back process to leave over only the side walls of the gate electrode 1505. The silicon nitride film thus left over functions as a side wall 1509.

Figure 15C:
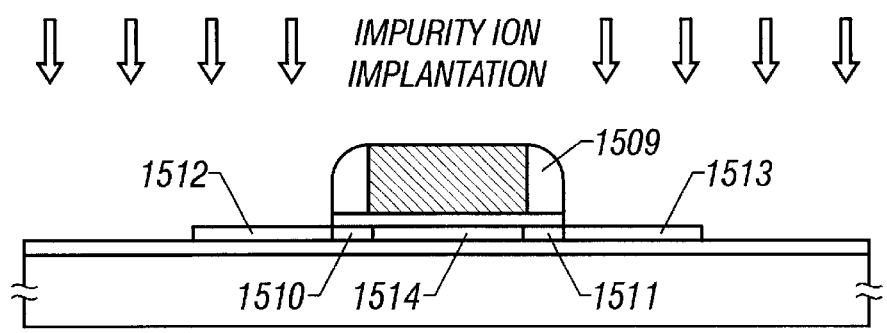

A state as is shown in FIG. 15(C) is thus realized by removing the gate insulating film 1504 except for the region for which the gate electrode 1505 and the side wall 1509 functioned as a mask.

Impurity ions are implanted thereafter to a state as is shown in FIG. 15(C). In this case, the dose is set at a value higher than that of the previous ion implantation. Because ion implantation is not performed on the regions 1510 and 1511 just under the side wall 1509, the concentration of the impurity ions remain the same. However, the exposed regions 1512 and 1513 are implanted further heavily with the impurity ions.

By thus performing the ion implantation twice, lightly doped drain regions (LDD regions) 1510 and 1511 containing the impurity ions at an impurity concentration lower than that of the source region 1512, drain region 1513, and source/drain region can be formed. The region just under the gate electrode 1506 is an undoped region and provides a channel forming region 1514.

After obtaining a state as is shown in FIG. 15(C) as a result of the above-mentioned process steps, a 300-Å-thick titanium film not shown in the figure is formed, and is allowed to react with the silicon film. Then, after removing the titanium film, a heat treatment such as lamp annealing is performed to form titanium silicide films 1515 to 1517 on the exposed surface of the source region 1512, drain region 1513, and gate electrode 1505 (FIG. 15(D)).

A tantalum film, a tungsten film, a molybdenum film, etc., can be used in place of titanium film mentioned above.

Figure 15D:
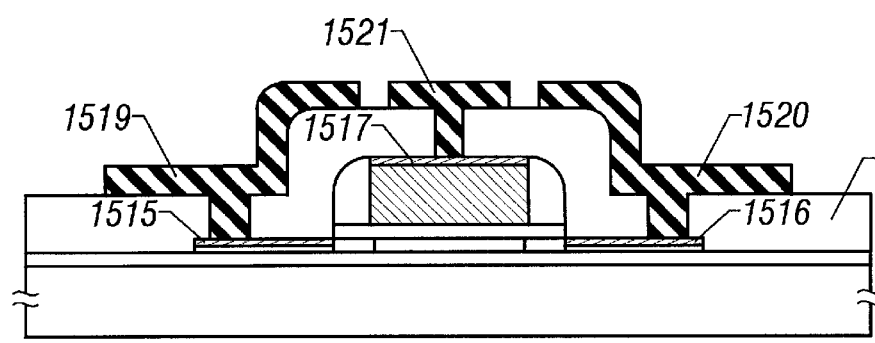

A 5,000-Å-thick silicon oxide film is then formed as an interlayer insulating film 1518, and a source wiring 1519, drain wiring 1520, and a gate wiring 1521. A TFT having a structure as is shown in FIG. 15(D) is thus completed.

In the TFT of the structure according to the present embodiment, the wiring is connected to the TFT via the titanium silicide films 1515 to 1517. Accordingly, a favorable ohmic contact can be implemented.

Embodiment 15

The semiconductor device as referred herein signifies a device which functions by using a semiconductor, and it includes an active matrix type electro-optical device (a liquid crystal display device, an EL display device, an EC display device, etc.) of the constitution described in Embodiment 11, and an application product into which the electro-optical device is embedded.

In the present embodiment, the application products are explained with reference to figures. Semiconductor device utilizing the present invention include a TV camera, a head mount display, a car navigation system, a projection type display (inclusive of a front type and a rear type), a video camera, a personal computer, etc. Brief explanation is given below with reference to FIGS. 16(A) to 16(F).

Figure 16A:
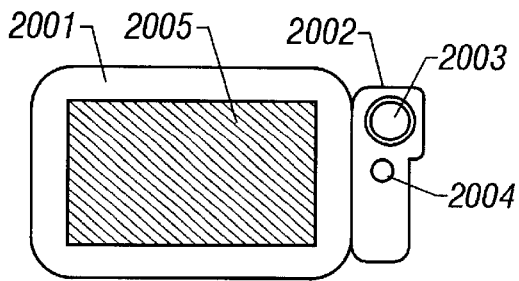
FIGS. 16(A) to 16(F) are explanatory figures of application products.

FIG. 16(A) shows a mobile computer comprising a body 2001, a camera 2002. an image receiver 2003, an operation switch 2004, and a display device 2005. The present invention is applied to, for example, the display device 2005 or an integrated circuit embedded inside the device.

Figure 16B:
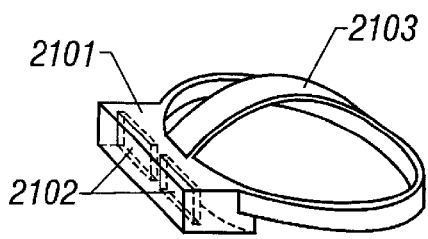

FIG. 16(B) shows a head mount display comprising a body 2101, a display device 2102, and a band portion 2103. Two relatively compact display devices 2102 are used.

Figure 16C:
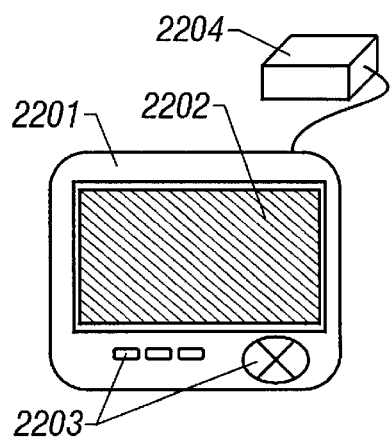

In FIG. 16(C) is shown a car navigation system comprising a body 2201, a display device 2202, an operation switch 2203, and an antenna 2204. The present invention is applied to, for example, the display device 2202 or an integrated circuit embedded inside the device. The display device 2202 is used as a monitor, but because it is used for displaying a map, the allowable range of image resolution is relatively wide.

Figure 16D:
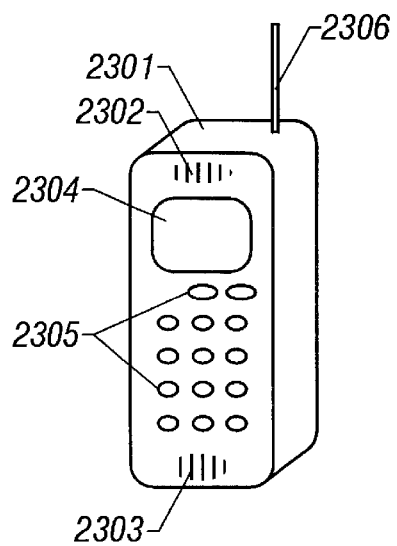

FIG. 16(D) is a portable phone comprising a body 2301, a voice output portion 2302, a voice input portion 2303, a display device 2304, an operation switch 2305, and an antenna 2306. The present invention is applied to, for example, the display device 2304 or an integrated circuit embedded inside the device.

Figure 16E:
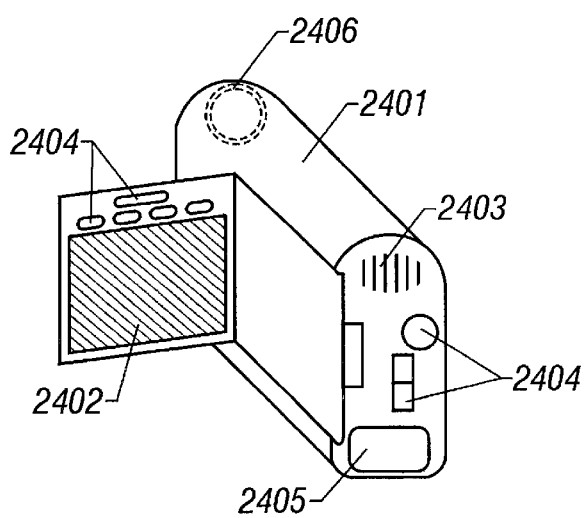

In FIG. 16(E) is shown a video camera comprising a body 2401, a display device 2402, a voice input portion 2403, an operation switch 2404, a battery 2405, and an image receiver 2406. The present invention is applied to, for example, the display device 2402 or an integrated circuit embedded inside the device.

Figure 16F:
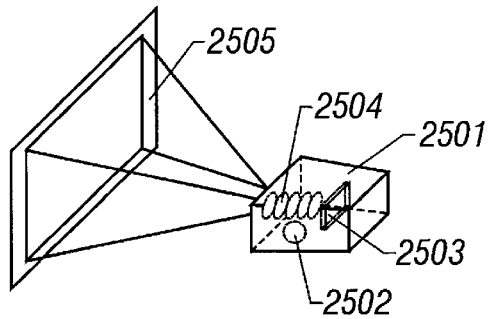

FIG. 16(F) is a front-type projection display comprising a body 2501, a light source 2502, a reflection type display device 2503, an optical system (inclusive of a beam splitter and a polarizer) 2504, and a screen 2505. Because the screen 2505 is used as a large area display for the presentation in a conference or a meeting, a high image resolution is required to the display device 2503.

In addition to the electro-optical devices described above, the present invention is applicable to, for example, a rear-type projection display or portable information terminal equipments such as a handy terminal. As is described above, the application range of the present invention is wide, and the present invention is applicable to any type of display media in various fields.

As is described hereinbefore, the present invention is characterized in that the crystal grain diameter is controlled by intentionally forming nucleation sites. The present invention is also characterized in that the crystal grains thus formed at a relatively large diameter are converted into a single crystal by irradiating a laser light and the like.

As an effect of the present technique, a monodomain region which can be regarded as substantially a single crystal is realized on a substrate having an insulating film on the surface thereof. That is, an active layer of a semiconductor device such as a thin film transistor can be constructed by using a crystalline silicon film having a high crystallinity well equivalent to that of a single crystal.

Thus, a semiconductor circuit having a performance well equivalent to that of a known integrated circuit using a single crystal wafer can be implemented.

While the invention has been described in detail and with reference to specific embodiments thereof, it will be apparent to one skilled in the art that various changes and modifications can be made therein without departing from the spirit and scope thereof.

What is claimed is:

1. A method of manufacturing a semiconductor device, said method comprising the steps of:

forming a transistor on a semiconductor substrate;

said transistor including:
   a first source region in the semiconductor substrate;
   a first drain region in the semiconductor substrate;
   a first channel region between the source and drain regions;
   a first gate electrode adjacent over at least the first channel region with a first gate insulating film interposed therebetween;

forming a first interlayer insulating film having a leveled surface over the transistor;

forming a second interlayer insulating film on the first interlayer insulating film;

forming an amorphous semiconductor film over the second interlayer insulating film;

crystallizing the amorphous semiconductor film to form a crystalline semiconductor film;

forming a second gate insulating film adjacent to the crystalline semiconductor film;

forming a second gate electrode adjacent to the crystalline semiconductor film with the second gate insulating film interposed therebetween;

introducing an impurity into the crystalline semiconductor film to form at least a second source region, a second drain region and a second channel region between the second source and drain regions.

2. A method according to claim 1, further comprising the step of:

forming at least a concave or convex portion on the second interlayer insulating film, wherein the crystallizing step of the amorphous semiconductor film proceeds starting at the concave or convex portion.

3. A method according to claim 2, wherein the concave or convex portion has a square fine island-like shape.

4. A method according to claim 2, wherein the concave or convex portion has a rectangular groove-like shape.

5. A method according to claim 1, further comprising the step of:

irradiating the crystalline semiconductor film with a light to modify the crystalline semiconductor film into a monodomain region.

6. A method of manufacturing a semiconductor device including a memory device, said memory device comprising:
   at least a memory cell including a thin film transistor and a capacitor;
   at least a first line connected to a gate electrode of the thin film transistor;

at least a second line connected to a source region of the thin film transistor;

said method comprising the steps of:

forming an amorphous semiconductor film over the substrate;

crystallizing the amorphous semiconductor film into a crystalline semiconductor film;

forming a gate insulating film adjacent to the crystalline semiconductor film;

forming the gate electrode adjacent to the crystalline semiconductor film with the gate insulating film interposed therebetween;

introducing an impurity into the crystalline semiconductor film to form the source region, a drain region and a channel region between the source and drain regions.

7. A method according to claim 6, further comprising the step of:

forming at least a concave or convex portion over the substrate;

wherein the crystallizing step of the amorphous semiconductor film proceeds starting at the concave or convex portion.

8. A method according to claim 7, wherein the concave or convex portion has a square fine island-like shape.

9. A method according to claim 7, wherein the concave or convex portion has a rectangular groove-like shape.

10. A method according to claim 6, further comprising the step of:

irradiating the crystalline semiconductor film with a light to modify the crystalline semiconductor film into a monodomain region.

* * * * *